(12) United States Patent
Kumar

(10) Patent No.: US 12,277,060 B2
(45) Date of Patent: Apr. 15, 2025

(54) APPLICATION MAPPING ON HARDENED NETWORK-ON-CHIP (NoC) OF FIELD-PROGRAMMABLE GATE ARRAY (FPGA)

(71) Applicant: Intel Corporation, Santa Clara, CA (US)

(72) Inventor: Sailesh Kumar, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 450 days.

(21) Appl. No.: 17/334,700

(22) Filed: May 29, 2021

(65) Prior Publication Data

US 2022/0012177 A1    Jan. 13, 2022

Related U.S. Application Data

(63) Continuation of application No. 16/258,366, filed on Jan. 25, 2019, now Pat. No. 11,023,377.
(Continued)

(51) Int. Cl.
*G06F 12/0813* (2016.01)
*G06F 9/38* (2018.01)
(Continued)

(52) U.S. Cl.
CPC ........ *G06F 12/0813* (2013.01); *G06F 9/3838* (2013.01); *G06F 12/0811* (2013.01);
(Continued)

(58) Field of Classification Search
CPC ..... H04L 49/109; H04L 49/205; H04L 47/10; H04L 47/125; H04L 47/805;
(Continued)

(56) References Cited

U.S. PATENT DOCUMENTS 7,724,735 B2   5/2010   Locatelli et al.
8,738,860 B1   5/2014   Griffin et al.
(Continued)

OTHER PUBLICATIONS

"Quality of Service in NoC for Reconfigurable Space Application", Ferrer et al.; 2009 NASA/ESA Conference on Adaptive Hardware and Systems (Year: 2009).*

*Primary Examiner* — Peter Chen
(74) *Attorney, Agent, or Firm* — Fletcher Yoder, P.C.

(57) ABSTRACT

Methods and example implementations described herein are generally directed to the addition of networks-on-chip (NoC) to FPGAs to customize traffic and optimize performance. An aspect of the present application relates to a Field-Programmable Gate-Array (FPGA) system. The FPGA system can include an FPGA having one or more lookup tables (LUTs) and wires, and a Network-on-Chip (NoC) having a hardened network topology configured to provide connectivity at a higher frequency that the FPGA. The NoC is coupled to the FPGA to receive an profile information associated with an application, retrieve at least a characteristic, selected form any of combination of any or combination of a bandwidth requirement, latency requirement, protocol requirement and transactions, associated with the application from the profile information, generate at least one application traffic graph having mapping information based on the characteristic retrieved, and map the application traffic graph generated with into the FPGA using the hardened NoC.

20 Claims, 13 Drawing Sheets

Related U.S. Application Data

(60) Provisional application No. 62/634,587, filed on Feb. 23, 2018.

(51) Int. Cl.
  *G06F 12/0811* (2016.01)
  *G06F 15/78* (2006.01)
  *G06F 30/331* (2020.01)
  *H04L 45/302* (2022.01)
  *H04L 45/586* (2022.01)
  *H04L 45/60* (2022.01)
  *H04L 49/109* (2022.01)

(52) U.S. Cl.
  CPC ........ *G06F 15/7807* (2013.01); *G06F 30/331* (2020.01); *H04L 45/302* (2013.01); *H04L 45/586* (2013.01); *H04L 45/60* (2013.01); *H04L 49/109* (2013.01)

(58) Field of Classification Search
  CPC ..... H04L 45/302; H04L 45/586; H04L 45/60; G06F 12/0811; G06F 12/0813; G06F 9/3838; G06F 15/7807; G06F 15/7825; G06F 15/7867; G06F 30/331
  See application file for complete search history.

(56) References Cited

U.S. PATENT DOCUMENTS

| | | | |
|---|---|---|---|
| 9,742,630 | B2 | 8/2017 | Philip et al. |
| 2003/0145314 | A1 | 7/2003 | Nguyen et al. |
| 2004/0049565 | A1 | 3/2004 | Keller et al. |
| 2004/0103218 | A1 | 5/2004 | Blumrich et al. |
| 2006/0075169 | A1 | 4/2006 | Harris et al. |
| 2006/0206297 | A1 | 9/2006 | Ishiyama |
| 2007/0038987 | A1 | 2/2007 | Ohara et al. |
| 2007/0147379 | A1 | 6/2007 | Lee et al. |
| 2007/0162903 | A1 | 7/2007 | Babb et al. |
| 2008/0126569 | A1 | 5/2008 | Rhim et al. |
| 2009/0157976 | A1 | 6/2009 | Comparan et al. |
| 2009/0182944 | A1 | 7/2009 | Comparan et al. |
| 2009/0182954 | A1 | 7/2009 | Mejdrich et al. |
| 2009/0182986 | A1 | 7/2009 | Schwinn et al. |
| 2009/0182987 | A1 | 7/2009 | Mejdrich et al. |
| 2009/0187716 | A1 | 7/2009 | Comparan et al. |
| 2009/0187734 | A1 | 7/2009 | Mejdrich et al. |
| 2009/0187756 | A1 | 7/2009 | Nollet et al. |
| 2009/0201302 | A1 | 8/2009 | Hoover et al. |
| 2009/0210184 | A1 | 8/2009 | Medardoni et al. |
| 2009/0210883 | A1 | 8/2009 | Hoover et al. |
| 2009/0228681 | A1 | 9/2009 | Mejdrich et al. |
| 2009/0228682 | A1 | 9/2009 | Mejdrich et al. |
| 2009/0228689 | A1 | 9/2009 | Muff et al. |
| 2009/0228690 | A1 | 9/2009 | Muff et al. |
| 2009/0231349 | A1 | 9/2009 | Mejdrich et al. |
| 2009/0240920 | A1 | 9/2009 | Muff et al. |
| 2009/0245257 | A1 | 10/2009 | Comparan et al. |
| 2009/0260013 | A1 | 10/2009 | Heil et al. |
| 2009/0271172 | A1 | 10/2009 | Mejdrich et al. |
| 2009/0276572 | A1 | 11/2009 | Heil et al. |
| 2009/0282139 | A1 | 11/2009 | Mejdrich et al. |
| 2009/0282197 | A1 | 11/2009 | Comparan et al. |
| 2009/0282211 | A1 | 11/2009 | Hoover et al. |
| 2009/0282214 | A1 | 11/2009 | Kuesel et al. |
| 2009/0282221 | A1 | 11/2009 | Heil et al. |
| 2009/0282226 | A1 | 11/2009 | Hoover et al. |
| 2009/0282419 | A1 | 11/2009 | Mejdrich et al. |
| 2009/0287885 | A1 | 11/2009 | Kriegel et al. |
| 2009/0292907 | A1 | 11/2009 | Schwinn et al. |
| 2009/0293061 | A1 | 11/2009 | Schwinn et al. |
| 2009/0300292 | A1 | 12/2009 | Fang et al. |
| 2009/0300335 | A1 | 12/2009 | Muff et al. |
| 2009/0307714 | A1 | 12/2009 | Hoover et al. |
| 2009/0313592 | A1 | 12/2009 | Murali et al. |
| 2009/0315908 | A1 | 12/2009 | Comparan et al. |
| 2010/0023568 | A1 | 1/2010 | Hickey et al. |
| 2010/0031009 | A1 | 2/2010 | Muff et al. |
| 2010/0042812 | A1 | 2/2010 | Hickey et al. |
| 2010/0042813 | A1 | 2/2010 | Hickey et al. |
| 2010/0070714 | A1 | 3/2010 | Hoover et al. |
| 2010/0091787 | A1 | 4/2010 | Muff et al. |
| 2010/0100707 | A1 | 4/2010 | Mejdrich et al. |
| 2010/0100712 | A1 | 4/2010 | Mejdrich et al. |
| 2010/0100770 | A1 | 4/2010 | Mejdrich et al. |
| 2010/0100934 | A1 | 4/2010 | Mejdrich et al. |
| 2010/0106940 | A1 | 4/2010 | Muff et al. |
| 2010/0125722 | A1 | 5/2010 | Hickey et al. |
| 2010/0189111 | A1 | 7/2010 | Muff et al. |
| 2010/0191940 | A1 | 7/2010 | Mejdrich et al. |
| 2010/0223505 | A1 | 9/2010 | Andreev et al. |
| 2010/0239185 | A1 | 9/2010 | Fowler et al. |
| 2010/0239186 | A1 | 9/2010 | Fowler et al. |
| 2010/0269123 | A1 | 10/2010 | Mejdrich et al. |
| 2010/0333099 | A1 | 12/2010 | Kupferschmidt et al. |
| 2011/0063285 | A1 | 3/2011 | Hoover et al. |
| 2011/0235531 | A1 | 9/2011 | Vangal et al. |
| 2011/0289485 | A1 | 11/2011 | Mejdrich et al. |
| 2011/0292063 | A1 | 12/2011 | Mejdrich et al. |
| 2011/0302450 | A1 | 12/2011 | Hickey et al. |
| 2011/0307734 | A1 | 12/2011 | Boesen et al. |
| 2011/0316864 | A1 | 12/2011 | Mejdrich et al. |
| 2011/0320719 | A1 | 12/2011 | Mejdrich et al. |
| 2011/0320724 | A1 | 12/2011 | Mejdrich et al. |
| 2011/0320854 | A1 | 12/2011 | Elrabaa |
| 2012/0054511 | A1 | 3/2012 | Brinks et al. |
| 2012/0110106 | A1 | 5/2012 | Lescure et al. |
| 2013/0028261 | A1 | 1/2013 | Lee |
| 2013/0073878 | A1 | 3/2013 | Jayasimha et al. |
| 2013/0103912 | A1 | 4/2013 | Jones et al. |
| 2013/0111242 | A1 | 5/2013 | Heller et al. |
| 2013/0179613 | A1 | 7/2013 | Boucard et al. |
| 2013/0179902 | A1 | 7/2013 | Hoover et al. |
| 2013/0191572 | A1 | 7/2013 | Nooney et al. |
| 2013/0254488 | A1 | 9/2013 | Kaxiras et al. |
| 2014/0068134 | A1 | 3/2014 | Sun |
| 2014/0211622 | A1 | 7/2014 | Kumar et al. |
| 2014/0254388 | A1 | 9/2014 | Kumar et al. |
| 2015/0026494 | A1 | 1/2015 | Bainbridge et al. |
| 2015/0043575 | A1 | 2/2015 | Kumar et al. |
| 2015/0109024 | A1* | 4/2015 | Abdelfattah ... H03K 19/017581 326/41 |
| 2015/0159330 | A1 | 6/2015 | Weisman et al. |
| 2015/0381707 | A1 | 12/2015 | How |
| 2016/0344629 | A1 | 11/2016 | Gray |
| 2017/0041249 | A1* | 2/2017 | Hutton ................ H04L 41/0893 |

\* cited by examiner (Related Art)

(Related Art)

|  INPUT |  | OUTPUT |
|---|---|---|
| 0 | 0 | 0 |
| 0 | 1 | 1 |
| 1 | 0 | 1 |
| 1 | 1 | 1 |

APPLICATION MAPPING ON HARDENED NETWORK-ON-CHIP (NoC) OF FIELD-PROGRAMMABLE GATE ARRAY (FPGA)

CROSS REFERENCE TO RELATED APPLICATION

This U.S. patent application is based on and claims the benefit of domestic priority under 35 U.S.C 119(e) from provisional U.S. patent application No. 62/634,587, filed on Feb. 23, 2018, the disclosure of which is hereby incorporated by reference herein in its entirety.

TECHNICAL FIELD

Methods and example implementations described herein are generally directed to Field-Programmable Gate-Arrays (FPGAs) or other programmable logic devices (PLDs) or other devices based thereon, and more specifically, to the addition of networks-on-chip (NoC) to FPGAs to customize traffic and optimize performance. This includes both modifications to the FPGA architecture and design flow.

RELATED ART

The number of components on a chip is rapidly growing due to increasing levels of integration, system complexity and shrinking transistor geometry. Complex System-on-Chips (SoCs) may involve a variety of components e.g., processor cores, DSPs, hardware accelerators, memory and I/O, while Chip Multi-Processors (CMPs) may involve a large number of homogenous processor cores, memory and I/O subsystems. In both SoC and CMP systems, the on-chip interconnect plays a role in providing high-performance communication between the various components. Due to scalability limitations of traditional buses and crossbar based interconnects, Network-on-Chip (NoC) has emerged as a paradigm to interconnect a large number of components on the chip. NoC is a global shared communication infrastructure made up of several routing nodes interconnected with each other using point-to-point physical links.

Messages are injected by the source and are routed from the source node to the destination over multiple intermediate nodes and physical links. The destination node then ejects the message and provides the message to the destination. For the remainder of this application, the terms 'components', 'blocks', 'hosts' or 'cores' will be used interchangeably to refer to the various system components which are interconnected using a NoC. Terms 'routers' and 'nodes' will also be used interchangeably. Without loss of generalization, the system with multiple interconnected components will itself be referred to as a 'multi-core system'.

There are several topologies in which the routers can connect to one another to create the system network. Bi-directional rings (as shown in FIG. 1A, 2-D (two dimensional) mesh (as shown in FIG. 1B), and 2-D Torus (as shown in FIG. 1C) are examples of topologies in the related art. Mesh and Torus can also be extended to 2.5-D (two and half dimensional) or 3-D (three dimensional) organizations. FIG. 1D shows a 3D mesh NoC, where there are three layers of 3×3 2D mesh NoC shown over each other. The NoC routers have up to two additional ports, one connecting to a router in the higher layer, and another connecting to a router in the lower layer. Router 111 in the middle layer of the example has its ports used, one connecting to the router 112 at the top layer and another connecting to the router 110 at the bottom layer. Routers 110 and 112 are at the bottom and top mesh layers respectively and therefore have only the upper facing port 113 and the lower facing port 114 respectively connected.

Packets are message transport units for intercommunication between various components. Routing involves identifying a path that is a set of routers and physical links of the network over which packets are sent from a source to a destination. Components are connected to one or multiple ports of one or multiple routers; with each such port having a unique identification (ID). Packets can carry the destination's router and port ID for use by the intermediate routers to route the packet to the destination component.

Examples of routing techniques include deterministic routing, which involves choosing the same path from A to B for every packet. This form of routing is independent from the state of the network and does not load balance across path diversities, which might exist in the underlying network. However, such deterministic routing may implemented in hardware, maintains packet ordering and may be rendered free of network level deadlocks. Shortest path routing may minimize the latency as such routing reduces the number of hops from the source to the destination. For this reason, the shortest path may also be the lowest power path for communication between the two components. Dimension-order routing is a form of deterministic shortest path routing in 2-D, 2.5-D, and 3-D mesh networks. In this routing scheme, messages are routed along each coordinates in a particular sequence until the message reaches the final destination. For example in a 3-D mesh network, one may first route along the X dimension until it reaches a router whose X-coordinate is equal to the X-coordinate of the destination router. Next, the message takes a turn and is routed in along Y dimension and finally takes another turn and moves along the Z dimension until the message reaches the final destination router. Dimension ordered routing may be minimal turn and shortest path routing.

FIG. 2A pictorially illustrates an example of XY routing in a two dimensional mesh. More specifically, FIG. 2A illustrates XY routing from node '34' to node '00'. In the example of FIG. 2A, each component is connected to only one port of one router. A packet is first routed over the X-axis till the packet reaches node '04' where the X-coordinate of the node is the same as the X-coordinate of the destination node. The packet is next routed over the Y-axis until the packet reaches the destination node.

In heterogeneous mesh topology in which one or more routers or one or more links are absent, dimension order routing may not be feasible between certain source and destination nodes, and alternative paths may have to be taken. The alternative paths may not be shortest or minimum turn.

Source routing and routing using tables are other routing options used in NoC. Adaptive routing can dynamically change the path taken between two points on the network based on the state of the network. This form of routing may be complex to analyze and implement.

A NoC interconnect may contain multiple physical networks. Over each physical network, there exist multiple virtual networks, wherein different message types are transmitted over different virtual networks. In this case, at each physical link or channel, there are multiple virtual channels; each virtual channel may have dedicated buffers at both end points. In any given clock cycle, only one virtual channel can transmit data on the physical channel.

NoC interconnects may employ wormhole routing, wherein, a large message or packet is broken into small pieces known as flits (also referred to as flow control digits). The first flit is a header flit, which holds information about this packet's route and key message level info along with payload data and sets up the routing behavior for all subsequent flits associated with the message. Optionally, one or more body flits follows the header flit, containing remaining payload of data. The final flit is a tail flit, which, in addition to containing last payload, also performs some bookkeeping to close the connection for the message. In wormhole flow control, virtual channels are often implemented.

The physical channels are time sliced into a number of independent logical channels called virtual channels (VCs). VCs provide multiple independent paths to route packets, however they are time-multiplexed on the physical channels. A virtual channel holds the state needed to coordinate the handling of the flits of a packet over a channel. At a minimum, this state identifies the output channel of the current node for the next hop of the route and the state of the virtual channel (idle, waiting for resources, or active). The virtual channel may also include pointers to the flits of the packet that are buffered on the current node and the number of flit buffers available on the next node.

The term "wormhole" plays on the way messages are transmitted over the channels: the output port at the next router can be so short that received data can be translated in the head flit before the full message arrives. This allows the router to quickly set up the route upon arrival of the head flit and then opt out from the rest of the conversation. Since a message is transmitted flit by flit, the message may occupy several flit buffers along its path at different routers, creating a worm-like image.

Based upon the traffic between various end points, and the routes and physical networks that are used for various messages, different physical channels of the NoC interconnect may experience different levels of load and congestion. The capacity of various physical channels of a NoC interconnect is determined by the width of the channel (number of physical wires) and the clock frequency at which it is operating. Various channels of the NoC may operate at different clock frequencies, and various channels may have different widths based on the bandwidth requirement at the channel. The bandwidth requirement at a channel is determined by the flows that traverse over the channel and their bandwidth values. Flows traversing over various NoC channels are affected by the routes taken by various flows. In a mesh or Torus NoC, there exist multiple route paths of equal length or number of hops between any pair of source and destination nodes. For example, in FIG. 2B, in addition to the standard XY route between nodes 34 and 00, there are additional routes available, such as YX route 203 or a multi-turn route 202 that makes more than one turn from source to destination.

In a NoC with statically allocated routes for various traffic slows, the load at various channels may be controlled by intelligently selecting the routes for various flows. When a large number of traffic flows and substantial path diversity is present, routes can be chosen such that the load on all NoC channels is balanced nearly uniformly, thus avoiding a single point of bottleneck. Once routed, the NoC channel widths can be determined based on the bandwidth demands of flows on the channels. Unfortunately, channel widths cannot be arbitrarily large due to physical hardware design restrictions, such as timing or wiring congestion. There may be a limit on the maximum channel width, thereby putting a limit on the maximum bandwidth of any single NoC channel.

Additionally, wider physical channels may not help in achieving higher bandwidth if messages are short. For example, if a packet is a single flit packet with a 64-bit width, then no matter how wide a channel is, the channel will only be able to carry 64 bits per cycle of data if all packets over the channel are similar. Thus, a channel width is also limited by the message size in the NoC. Due to these limitations on the maximum NoC channel width, a channel may not have enough bandwidth in spite of balancing the routes.

To address the above bandwidth concern, multiple parallel physical NoCs may be used. Each NoC may be called a layer, thus creating a multi-layer NoC architecture. Hosts inject a message on a NoC layer; the message is then routed to the destination on the NoC layer, where it is delivered from the NoC layer to the host. Thus, each layer operates more or less independently from each other, and interactions between layers may only occur during the injection and ejection times. FIG. 3A illustrates a two layer NoC. Here the two NoC layers are shown adjacent to each other on the left and right, with the hosts connected to the NoC replicated in both left and right diagrams. A host is connected to two routers in this example—a router in the first layer shown as R1, and a router is the second layer shown as R2. In this example, the multi-layer NoC is different from the 3D NoC, i.e. multiple layers are on a single silicon die and are used to meet the high bandwidth demands of the communication between hosts on the same silicon die. Messages do not go from one layer to another. For purposes of clarity, the present application will utilize such a horizontal left and right illustration for multi-layer NoC to differentiate from the 3D NoCs, which are illustrated by drawing the NoCs vertically over each other.

In FIG. 3B, a host connected to a router from each layer, R1 and R2 respectively, is illustrated. Each router is connected to other routers in its layer using directional ports 301, and is connected to the host using injection and ejection ports 302. A bridge-logic 303 may sit between the host and the two NoC layers to determine the NoC layer for an outgoing message and sends the message from host to the NoC layer, and also perform the arbitration and multiplexing between incoming messages from the two NoC layers and delivers them to the host.

In a multi-layer NoC, the number of layers needed may depend upon a number of factors such as the aggregate bandwidth requirement of all traffic flows in the system, the routes that are used by various flows, message size distribution, maximum channel width, etc. Once the number of NoC layers in NoC interconnect is determined in a design, different messages and traffic flows may be routed over different NoC layers. Additionally, one may design NoC interconnects such that different layers have different topologies in number of routers, channels and connectivity. The channels in different layers may have different widths based on the flows that traverse over the channel and their bandwidth requirements.

System on Chips (SoCs) are becoming increasingly sophisticated, feature rich, and high performance by integrating a growing number of standard processor cores, memory and I/O subsystems, and specialized acceleration IPs. To address this complexity, NoC approach of connecting SoC components is gaining popularity. A NoC can provide connectivity to a plethora of components and interfaces and simultaneously enable rapid design closure by being automatically generated from a high level specification. The specification describes interconnect requirements of SoC in terms of connectivity, bandwidth, and latency. In addition to this, information such as position of various components such as bridges or ports on boundary of hosts, traffic information, chip size information, etc. may be supplied. A NoC compiler (topology generation engine) can then use this specification to automatically design a NoC for the SoC. A number of NoC compilers were introduced in the related art that automatically synthesize a NoC to fit a traffic specification. In such design flows, the synthesized NoC is simulated to evaluate the performance under various operating conditions and to determine whether the specifications are met. This may be necessary because NoC-style interconnects are distributed systems and their dynamic performance characteristics under load are difficult to predict statically and can be very sensitive to a wide variety of parameters. Specifications can also be in the form of power specifications to define power domains, voltage domains, clock domains, and so on, depending on the desired implementation.

Placing hosts/IP cores in a SoC floorplan to optimize the interconnect performance can be important. For example, if two hosts communicate with each other frequently and require higher bandwidth than other interconnects, it may be better to place them closer to each other so that the transactions between these hosts can go over fewer router hops and links and the overall latency and the NoC cost can be reduced.

Assuming that two hosts with certain shapes and sizes cannot spatially overlap with each other on a 2D SoC plane, tradeoffs may need to be made. Moving certain hosts closer to improve inter-communication between them, may force certain other hosts to be further apart, thereby penalizing inter-communication between those other hosts. To make tradeoffs that improve system performance, certain performance metrics such as average global communication latency may be used as an objective function to optimize the SoC architecture with the hosts being placed in a NoC topology. Determining substantially optimal host positions that maximizes the system performance metric may involve analyzing the connectivity and inter-communication properties between all hosts and judiciously placing them onto the 2D NoC topology. In case if inter-communicating hosts are placed far from each other, this can leads to high average and peak structural latencies in number of hops. Such long paths not only increase latency but also adversely affect the interconnect bandwidth, as messages stay in the NoC for longer periods and consume bandwidth of a large number of links.

Also, existing integrated circuits such as programmable logic devices (PLDs) typically utilize "point-to-point" routing, meaning that a path between a source signal generator and one or more destinations is generally fixed at compile time. For example, a typical implementation of an A-to-B connection in a PLD involves connecting logic areas through an interconnect stack of pre-defined horizontal wires. These horizontal wires have a fixed length, are arranged into bundles, and are typically reserved for that A-to-B connection for the entire operation of the PLDs configuration bit stream. Even where a user is able to subsequently change some features of the point-to-point routing, e.g., through partial recompilation, such changes generally apply to block-level replacements, and not to cycle-by-cycle routing implementations.

Such existing routing methods may render the device inefficient, e.g., when the routing is not used every cycle. A first form of inefficiency occurs because of inefficient wire use. In a first example, when an A-to-B connection is rarely used (for example, if the signal value generated by the source logic area at A rarely changes or the destination logic area at B is rarely programmed to be affected by the result), then the conductors used to implement the A-to-B connection may unnecessarily take up metal, power, and/or logic resources. In a second example, when a multiplexed bus having N inputs is implemented in a point-to-point fashion, metal resources may be wasted on routing data from each of the N possible input wires because the multiplexed bus, by definition, outputs only one of the N input wires and ignores the other N−1 input wires. Power resources may also be wasted in these examples when spent in connection with data changes that do not affect a later computation. A more general form of this inefficient wire use occurs when more than one producer generates data that is serialized through a single consumer or the symmetric case where one producer produces data that is used in a round-robin fashion by two or more consumers.

A second form of inefficiency, called slack-based inefficiency, occurs when a wire is used, but below its full potential, e.g., in terms of delay. For example, if the data between a producer and a consumer is required to be transmitted every 300 ps, and the conductor between them is capable of transmitting the data in a faster, 100 ps timescale, then the 200 ps of slack time in which the conductor is idle is a form of inefficiency or wasted bandwidth. These two forms of wire underutilization, e.g., inefficient wire use and slack-based inefficiency, can occur separately or together, leading to inefficient use of resources, and wasting valuable wiring, power, and programmable multiplexing resources.

In many cases, the high-level description of the logic implemented on a PLD may already imply sharing of resources, such as sharing access to an external memory or a high-speed transceiver. To do this, it is common to synthesize higher-level structures representing busses onto PLDs. In one example, a software tool may generate an industry-defined bus as Register-Transfer-Level (RTL)/Verilog logic, which is then synthesized into an FPGA device. In this case, however, that shared bus structure is still implemented in the manner discussed above, meaning that it is actually converted into point-to-point static routing. Even in a scheme involving time-multiplexing of FPGA wires, routing is still limited to an individual-wire basis and does not offer grouping capabilities.

In large-scale networks, efficiency and performance/area tradeoff is of main concern. Mechanisms such as machine learning approach, simulation annealing, among others, provide optimized topology for a system. However, such complex mechanisms have substantial limitations as they involve certain algorithms to automate optimization of layout network, which may violate previously mapped flow's latency constraint or the latency constraint of current flow. Further, it is also to be considered that each user has their own requirements and/or need for SoCs and/or NoCs depending on a diverse applicability of the same. Therefore, there is a need for systems and methods that significantly improve system efficiency by accurately indicating the best possible positions and configurations for hosts and ports within the hosts, along with indicating system level routes to be taken for traffic flows using the NoC interconnect architecture. Systems and methods are also required for automatically generating an optimized topology for a given SoC floor plan and traffic specification with an efficient layout. Further, systems and methods are also required that allows users to specify their requirements for a particular SoC and/or NoC, provides various options for satisfying their requirements and based on this automatically generating an optimized topology for a given SoC floor plan and traffic specification with an efficient layout.

Integrating NoC with FPGA since bandwidth requirements are increasing rapidly and FPGAs are becoming bigger and bigger. However, FPGAs are becoming bigger and bigger the conventional soft logic to provide sufficient bandwidth is also growing rapid which are not achieved by the conventional techniques. Thus there is requirement of provide a combination of hardened logic and soft logic to provide a probability of achieving the requirements.

Also, once the hardened NoC is built over the FPGA, there is a need for mapping the traffic incoming and outgoing to a particular layer or merchant channel of within layer routing their needs a flexibility to choose route for the traffic (since there are multiple routes present).

In a NoC interconnect, if the traffic profile is not uniform and there is a certain amount of heterogeneity (e.g., certain hosts talking to each other more frequently than the others), the interconnect performance may depend on the NoC topology and where various hosts are placed in the topology with respect to each other and to what routers they are connected to. For example, if two hosts talk to each other frequently and require higher bandwidth than other interconnects, then they should be placed next to each other. This will reduce the latency for this communication which thereby reduces the global average latency, as well as reduce the number of router nodes and links over which the higher bandwidth of this communication must be provisioned.

Moving two hosts closer together may make certain other hosts far apart since all hosts must fit into the 2D planar NoC topology without overlapping with each other. Thus, various tradeoffs must be made and the hosts must be placed after examining the pair-wise bandwidth and latency requirements between all hosts so that certain global cost and performance metrics is optimized. The cost and performance metrics can be, for example, average structural latency between all communicating hosts in number of router hops, or sum of bandwidth between all pair of hosts and the distance between them in number of hops, or some combination of these two. This optimization problem is known to be NP-hard and heuristic based approaches are often used. The hosts in a system may vary in shape and sizes with respect to each other, which puts additional complexity in placing them in a 2D planar NoC topology, packing them optimally while leaving little whitespaces, and avoiding overlapping hosts.

The optimization approaches introduced so far to determine the channel capacity, routes, host positions, etc., are useful when the exact traffic profile is known in advance at the NoC design time. If the precise traffic profile is not known at the design time, and the traffic profile changes during the NoC operation based on the SoC application's requirements, then the NoC design must allow these adjustments. For the NoC to allow these changes, the NoC must be designed so that it has knowledge of the changes that may occur in the traffic profile in a given system and ensure that any combination of allowable traffic profiles are supported by the NoC hardware architecture.

Therefore, there exists a need for methods, systems, and computer readable mediums for overcoming the above-mentioned issues with existing implementations of generating topology for a given NoC. Further, there exists a need for methods, systems, and computer readable mediums for having a programmable fabric and a communication network integrated with the programmable fabric for high-speed data passing.

SUMMARY

Methods and example implementations described herein are generally directed to Field-Programmable Gate-Arrays (FPGAs) or other programmable logic devices (PLDs) or other devices based thereon, and more specifically, to the addition of networks-on-chip (NoC) to FPGAs to customize traffic and optimize performance. This includes both modifications to the FPGA architecture and design flow.

Aspects of the present application relate to methods, systems, and computer readable mediums for overcoming the above-mentioned issues with existing implementations of generating topology for a given NoC by significantly improving system efficiency by facilitating efficient creation of NoC designs utilizing existing or new circuit block information. The system and method provides a programmable fabric and a communication network integrated with the programmable fabric for high-speed data passing.

An aspect of the present application relates to a Field-Programmable Gate-Array (FPGA) system. The FPGA system can include an FPGA having one or more lookup tables (LUTs) and wires, and a Network-on-Chip (NoC) having a hardened network topology configured to provide connectivity at a higher frequency that the FPGA. The NoC is coupled to the FPGA to receive an profile information associated with an application, retrieve at least a characteristic, selected form any of combination of any or combination of a bandwidth requirement, latency requirement, protocol requirement and transactions, associated with the application from the profile information, generate at least one application traffic graph having mapping information based on the characteristic retrieved, and map the application traffic graph generated with into the FPGA using the hardened NoC.

In an aspect, while the hardened NoC is deployed in the FPGA, reconfiguring the hardened NoC in accordance with the application traffic graph. In another aspect, reconfiguring the hardened NoC comprises receiving mapping information for one or more characteristic associated with the application and transmitting the mapping information to the hardened NoC.

In an aspect, the application traffic graph includes a plurality of nodes indicative of representations of traffic associated with the application, wherein the plurality of nodes interacts based on bandwidth requirements, latency requirements, protocol requirements and transactions retrieved.

In an aspect, the mapping information comprises transaction assignments of one or more traffic profiles to each NoC layer in the hardened NoC and route assignments for each NoC layer in the hardened NoC.

In an aspect, the hardened NoC further determines all allowed subsets of the plurality of application traffic profiles, and determine a NoC configuration that is configured to support the determined all allowed subsets. In another aspect, the NoC configuration is further includes one or more physical channels, one or more virtual channels, one or more NoC layers, Quality of Service (QoS) parameters for each of the one or more physical channels and the one or more virtual channels, and weights for each of the one or more physical channels and the one or more virtual channels.

In an aspect, the application traffic graph is received from a user. In another aspect, the application traffic graph is generated based on the traffic profile fed to the FPGA system. In yet another aspect, the application traffic graph is generated based on one or more meta-data associated with one or more packet received by the FPGA system.

In an aspect, the system is further configured to determine at least a part of application graph to be mapped with the hardened NoC and at least a part of application graph to be mapped with the soft logic.

In an aspect, the NoC includes a mechanism for being configured by software to modify one or more functions associated with the NoC. In another aspect, the one or more functions of the NoC are associated with any of combination quality of service (QoS), priority, virtual channel (VC) allocation, rate limits, buffer sizing, layer/physical channel assignment.

In an aspect, the NoC includes virtual channel (VC) and physical layers allocated based at least on quality of service (QoS), latency, bandwidth requirements, number of inputs/outputs (I/Os), memories, soft intellectual properties (IPs) that are connected to the NoC.

In an aspect, the NoC includes one or more bridges configured to support multiple protocols.

In an aspect, the NoC includes at least a programmable decoding element to determine any or combination of a route, a layer and destination information from one or more messages transported over the NoC.

An aspect of the present application is to provide a method that include the steps of receiving an profile information associated with an application by a Network-on-Chip (NoC), retrieving at least a characteristic, selected from any or combination of a bandwidth requirement, latency requirement, protocol requirement and transactions, associated with the application from the profile information, generating at least one application traffic graph having mapping information based on the characteristic retrieved, and mapping the application traffic graph generated with into the FPGA using the hardened NoC.

In an aspect, while the hardened NoC is deployed in the FPGA, reconfiguring the hardened NoC in accordance with the application traffic graph. In another aspect, reconfiguring the hardened NoC comprises receiving mapping information for one or more characteristic associated with the application and transmitting the mapping information to the hardened NoC.

In an aspect, the application traffic graph includes a plurality of nodes indicative of representations of traffic associated with the application, wherein the plurality of nodes interacts based on bandwidth requirements, latency requirements, protocol requirements and transactions retrieved.

In an aspect, the mapping information comprises transaction assignments of one or more traffic profiles to each NoC layer in the hardened NoC and route assignments for each NoC layer in the hardened NoC.

In an aspect, the hardened NoC further determines all allowed subsets of the plurality of application traffic profiles, and determine a NoC configuration that is configured to support the determined all allowed subsets. In another aspect, the NoC configuration is further includes one or more physical channels, one or more virtual channels, one or more NoC layers, Quality of Service (QoS) parameters for each of the one or more physical channels and the one or more virtual channels, and weights for each of the one or more physical channels and the one or more virtual channels.

In an aspect, the application traffic graph is received from a user. In another aspect, the application traffic graph is generated based on the traffic profile fed to the FPGA system. In yet another aspect, the application traffic graph is generated based on one or more meta-data associated with one or more packet received by the FPGA system.

In an aspect, the method can further determine at least a part of application graph to be mapped with the hardened NoC and at least a part of application graph to be mapped with the soft logic.

In an aspect, the NoC includes a mechanism for being configured by software to modify one or more functions associated with the NoC. In another aspect, the one or more functions of the NoC are associated with any of combination quality of service (QoS), priority, virtual channel (VC) allocation, rate limits, buffer sizing, layer/physical channel assignment.

In an aspect, the NoC includes virtual channel (VC) and physical layers allocated based at least on quality of service (QoS), latency, bandwidth requirements, number of inputs/outputs (I/Os), memories, soft intellectual properties (IPs) that are connected to the NoC.

In an aspect, the NoC includes one or more bridges configured to support multiple protocols.

In an aspect, the NoC includes at least a programmable decoding element to determine any or combination of a route, a layer and destination information from one or more messages transported over the NoC.

An aspect of the present application relates to a non-transitory computer readable storage medium storing instructions for executing a process. The instructions include the steps of receiving an profile information associated with an application, retrieving at least a characteristic, selected from any or combination of a bandwidth requirement, latency requirement, protocol requirement and transactions, associated with the application from the profile information, generating at least one application traffic graph having mapping information based on the characteristic retrieved, and mapping the application traffic graph generated with into the FPGA using the hardened NoC.

The foregoing and other objects, features and advantages of the example implementations will be apparent and the following more particular descriptions of example implementations as illustrated in the accompanying drawings wherein like reference numbers generally represent like parts of exemplary implementations of the application.

DETAILED DESCRIPTION

Figure 1A:
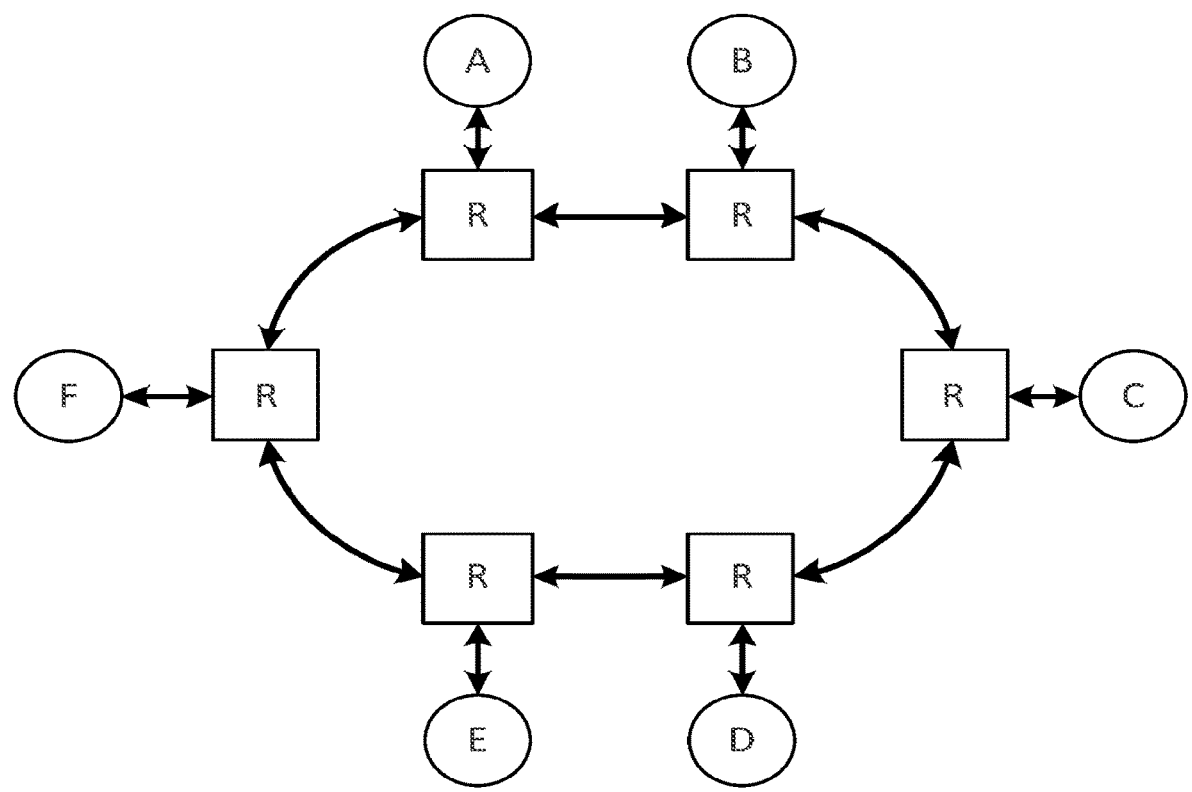
FIGS. 1A, 1B, 1C, and 1D illustrate examples of Bidirectional ring, 2D Mesh, 2D Torus, and 3D Mesh NoC Topologies.
Figure 1B:
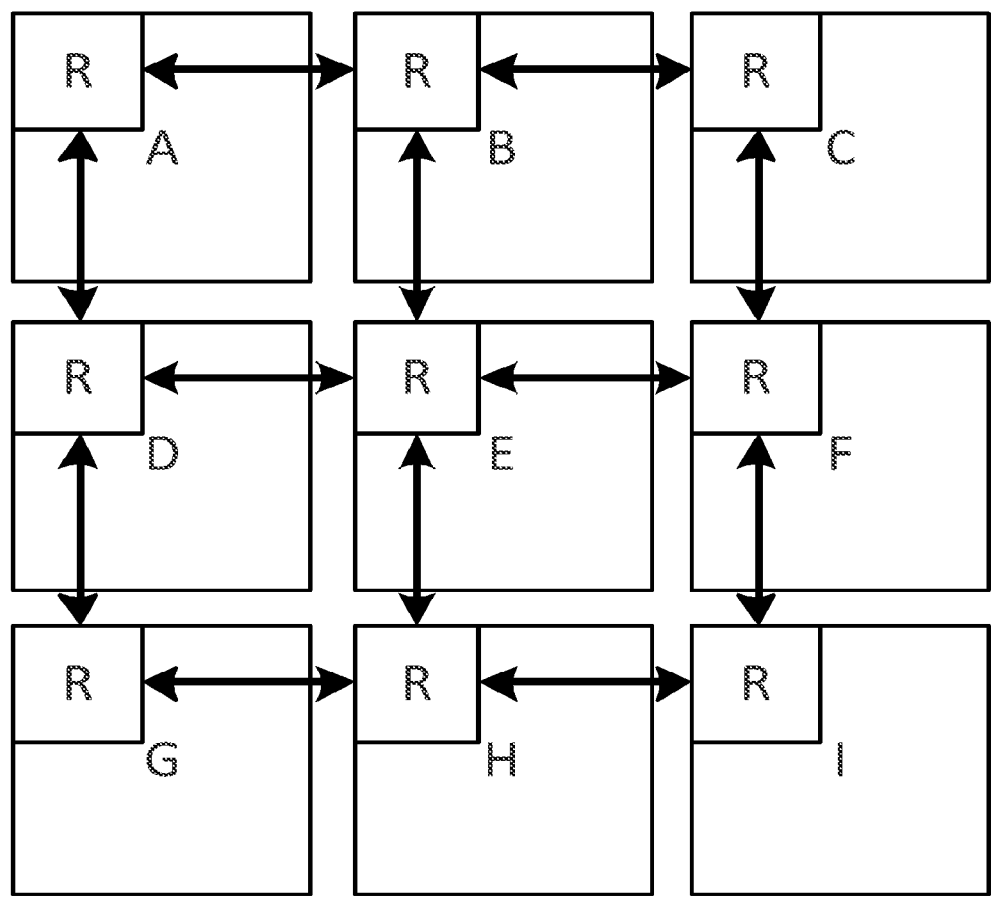
Figure 1C:
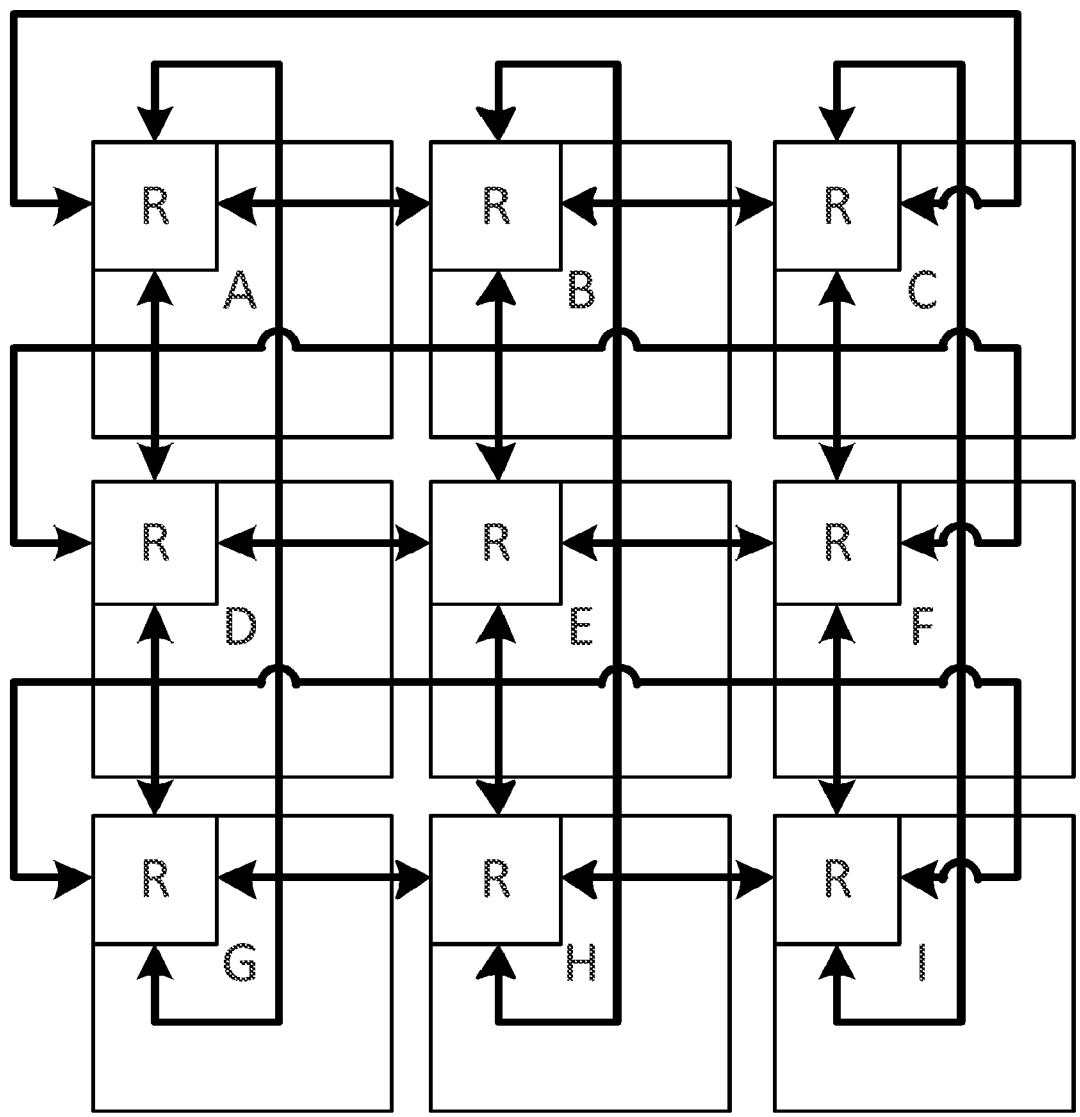
Figure 1D:
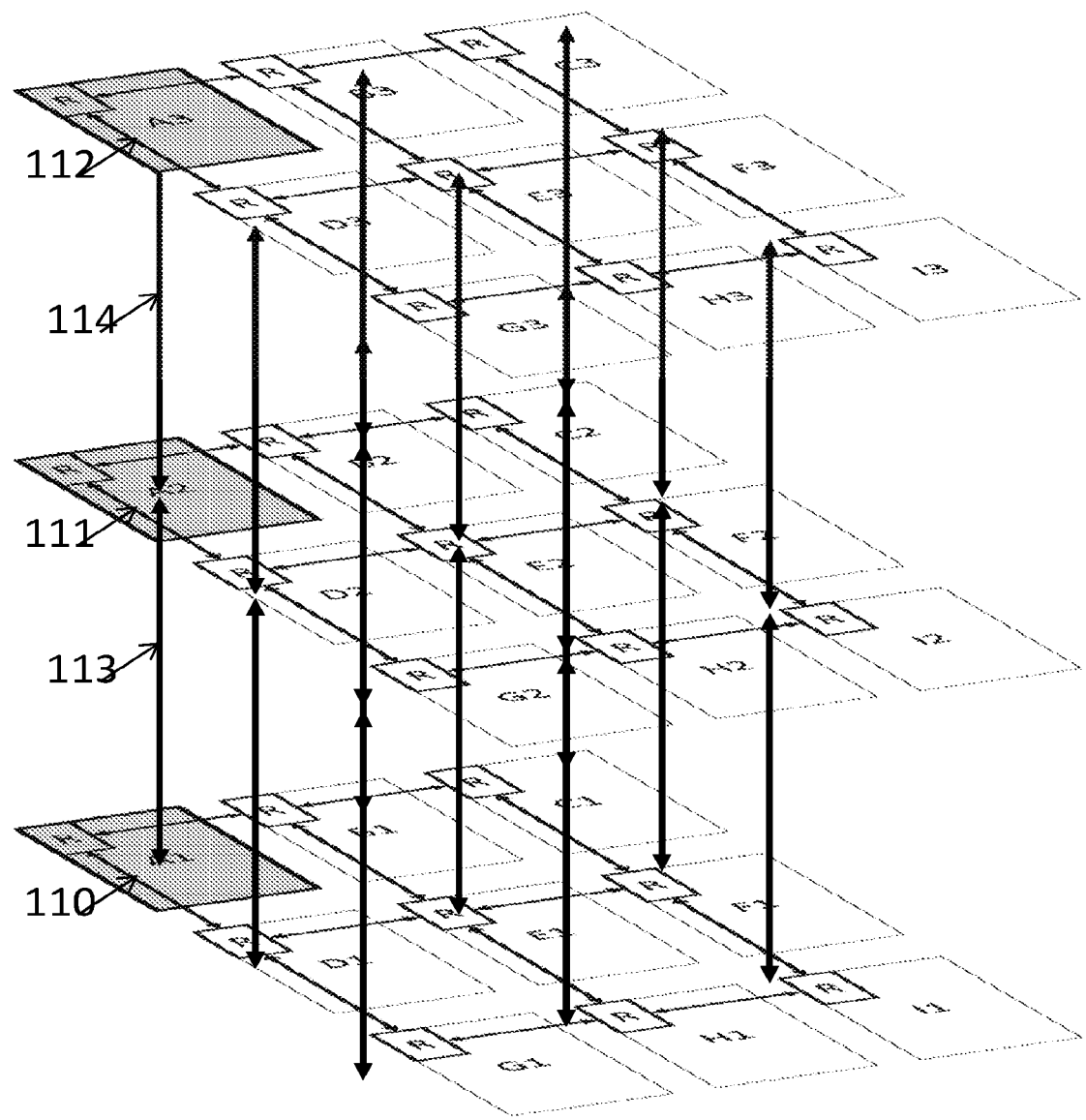
Figure 2A:
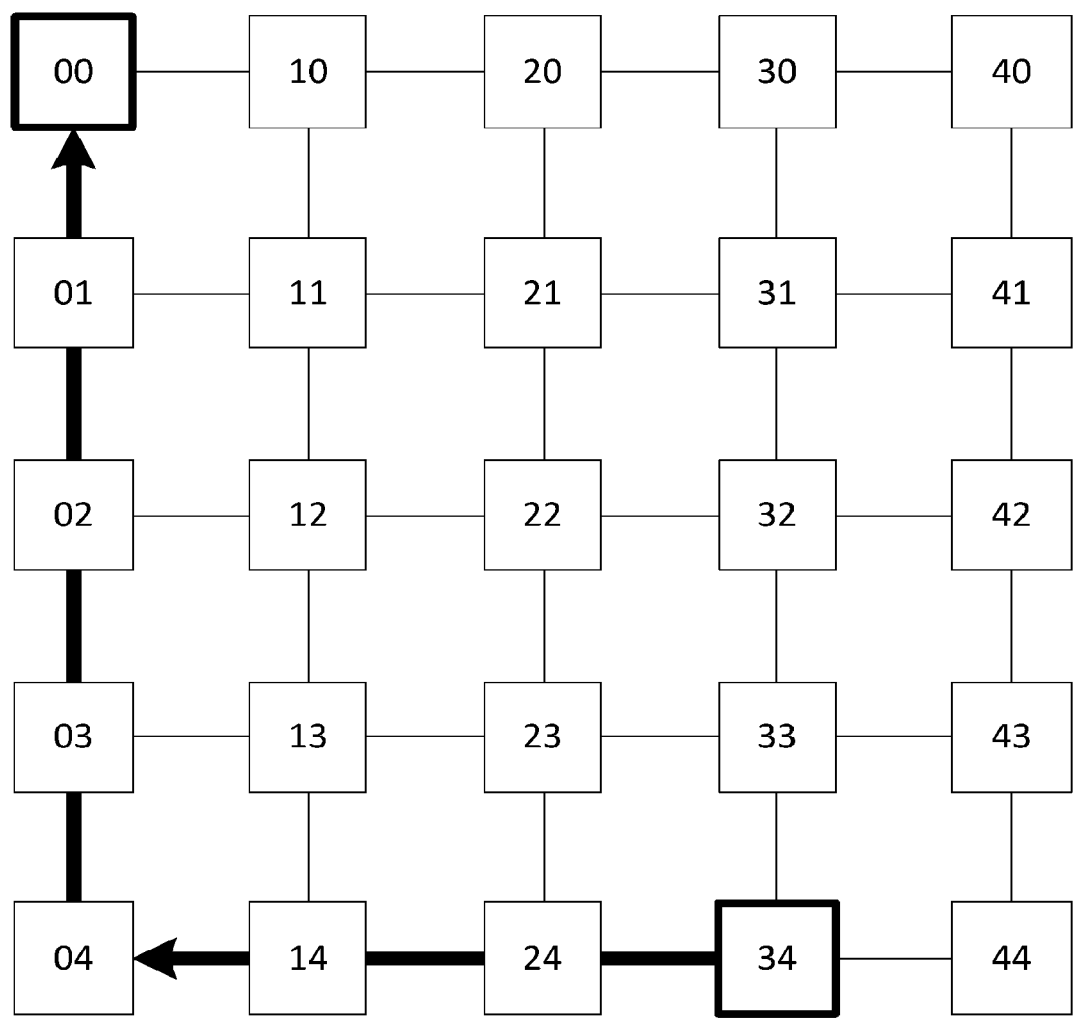
FIG. 2A illustrates an example of XY routing in a related art two dimensional mesh.
Figure 2B:
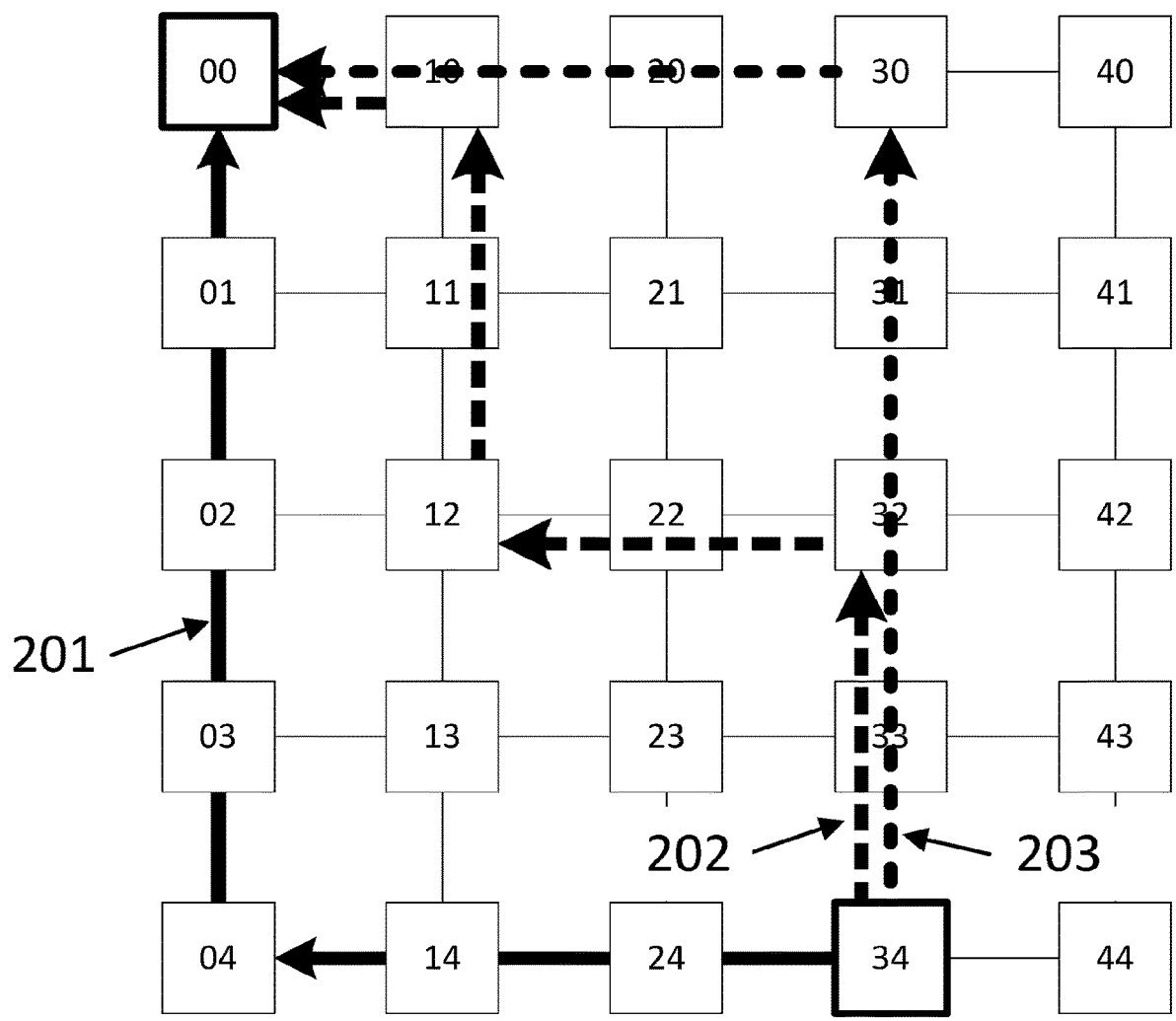
FIG. 2B illustrates three different routes between a source and destination nodes.
Figure 3A:
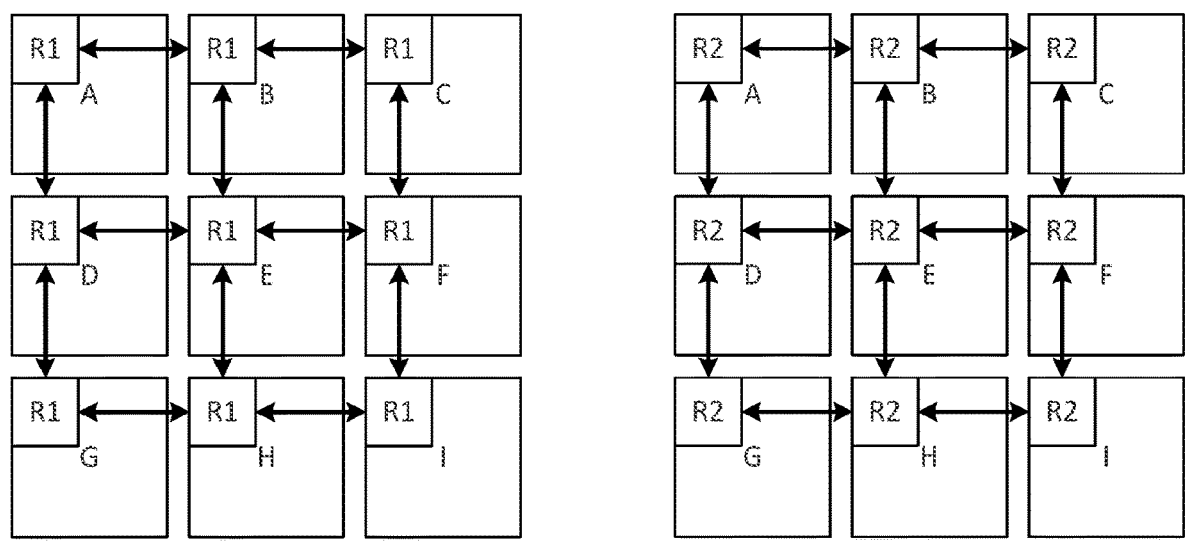
FIG. 3A illustrates an example of a related art two layer NoC interconnect.
Figure 3B:
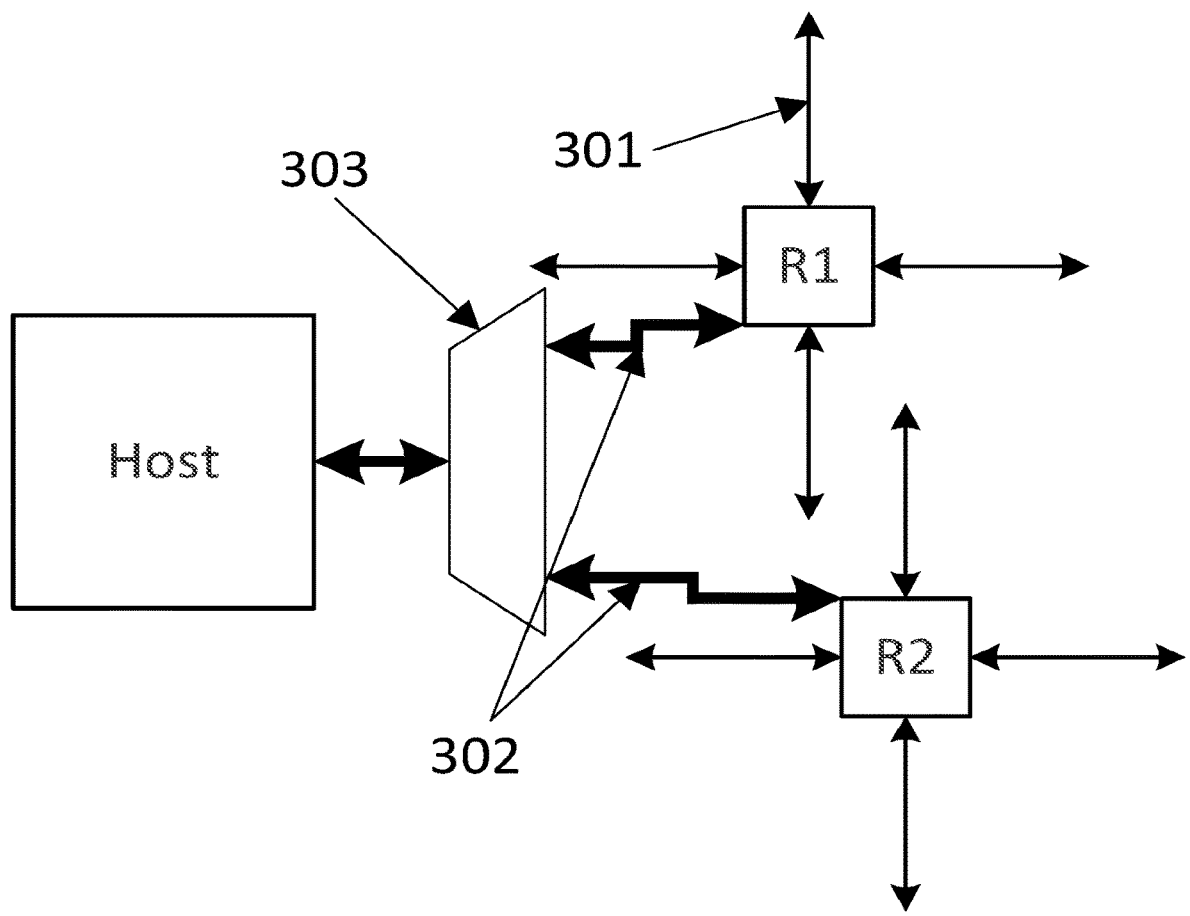
FIG. 3B illustrates the related art bridge logic between host and multiple NoC layers.

The following detailed description provides further details of the figures and example implementations of the present application. Reference numerals and descriptions of redundant elements between figures are omitted for clarity. Terms used throughout the description are provided as examples and are not intended to be limiting. For example, the use of the term "automatic" may involve fully automatic or semi-automatic implementations involving user or administrator control over certain aspects of the implementation, depending on the desired implementation of one of ordinary skill in the art practicing implementations of the present application.

Network-on-Chip (NoC) has emerged as a paradigm to interconnect a large number of components on the chip. NoC is a global shared communication infrastructure made up of several routing nodes interconnected with each other using point-to-point physical links. In example implementations, a NoC interconnect is generated from a specification by utilizing design tools. The specification can include constraints such as bandwidth/Quality of Service (QoS)/latency attributes that is to be met by the NoC, and can be in various software formats depending on the design tools utilized. Once the NoC is generated through the use of design tools on the specification to meet the specification requirements, the physical architecture can be implemented either by manufacturing a chip layout to facilitate the NoC or by generation of a register transfer level (RTL) for execution on a chip to emulate the generated NoC, depending on the desired implementation. Specifications may be in common power format (CPF), Unified Power Format (UPF), or others according to the desired specification. Specifications can be in the form of traffic specifications indicating the traffic, bandwidth requirements, latency requirements, interconnections, etc. depending on the desired implementation. Specifications can also be in the form of power specifications to define power domains, voltage domains, clock domains, and so on, depending on the desired implementation.

Methods and example implementations described herein are generally directed to Field-Programmable Gate-Arrays (FPGAs) or other programmable logic devices (PLDs) or other devices based thereon, and more specifically, to the addition of networks-on-chip (NoC) to FPGAs to customize traffic and optimize performance. This includes both modifications to the FPGA architecture and design flow.

Aspects of the present application relate to methods, systems, and computer readable mediums for overcoming the above-mentioned issues with existing implementations of generating topology for a given NoC by significantly improving system efficiency by facilitating efficient creation of NoC designs utilizing existing or new circuit block information. The system and method provides a programmable fabric and a communication network integrated with the programmable fabric for high-speed data passing.

An aspect of the present application relates to a Field-Programmable Gate-Array (FPGA) system. The FPGA system can include an FPGA having one or more lookup tables (LUTs) and wires, and a Network-on-Chip (NoC) having a hardened network topology configured to provide connectivity at a higher frequency that the FPGA. The NoC is coupled to the FPGA to receive an profile information associated with an application, retrieve at least a characteristic, selected form any of combination of any or combination of a bandwidth requirement, latency requirement, protocol requirement and transactions, associated with the application from the profile information, generate at least one application traffic graph having mapping information based on the characteristic retrieved, and map the application traffic graph generated with into the FPGA using the hardened NoC.

In an aspect, while the hardened NoC is deployed in the FPGA, reconfiguring the hardened NoC in accordance with the application traffic graph. In another aspect, reconfiguring the hardened NoC comprises receiving mapping information for one or more characteristic associated with the application and transmitting the mapping information to the hardened NoC.

In an aspect, the application traffic graph includes a plurality of nodes indicative of representations of traffic associated with the application, wherein the plurality of nodes interacts based on bandwidth requirements, latency requirements, protocol requirements and transactions retrieved.

In an aspect, the mapping information comprises transaction assignments of one or more traffic profiles to each NoC layer in the hardened NoC and route assignments for each NoC layer in the hardened NoC.

In an aspect, the hardened NoC further determines all allowed subsets of the plurality of application traffic profiles, and determine a NoC configuration that is configured to support the determined all allowed subsets. In another aspect, the NoC configuration is further includes one or more physical channels, one or more virtual channels, one or more NoC layers, Quality of Service (QoS) parameters for each of the one or more physical channels and the one or more virtual channels, and weights for each of the one or more physical channels and the one or more virtual channels.

In an aspect, the application traffic graph is received from a user. In another aspect, the application traffic graph is generated based on the traffic profile fed to the FPGA system. In yet another aspect, the application traffic graph is generated based on one or more meta-data associated with one or more packet received by the FPGA system.

In an aspect, the system is further configured to determine at least a part of application graph to be mapped with the hardened NoC and at least a part of application graph to be mapped with the soft logic.

In an aspect, the NoC includes a mechanism for being configured by software to modify one or more functions associated with the NoC. In another aspect, the one or more functions of the NoC are associated with any of combination quality of service (QoS), priority, virtual channel (VC) allocation, rate limits, buffer sizing, layer/physical channel assignment.

In an aspect, the NoC includes virtual channel (VC) and physical layers allocated based at least on quality of service (QoS), latency, bandwidth requirements, number of inputs/outputs (I/Os), memories, soft intellectual properties (IPs) that are connected to the NoC.

In an aspect, the NoC includes one or more bridges configured to support multiple protocols.

In an aspect, the NoC includes at least a programmable decoding element to determine any or combination of a route, a layer and destination information from one or more messages transported over the NoC.

An aspect of the present application is to provide a method that include the steps of receiving an profile information associated with an application by a Network-on-Chip (NoC), retrieving at least a characteristic, selected from any or combination of a bandwidth requirement, latency requirement, protocol requirement and transactions, associated with the application from the profile information, generating at least one application traffic graph having mapping information based on the characteristic retrieved, and mapping the application traffic graph generated with into the FPGA using the hardened NoC.

In an aspect, while the hardened NoC is deployed in the FPGA, reconfiguring the hardened NoC in accordance with the application traffic graph. In another aspect, reconfiguring the hardened NoC comprises receiving mapping information for one or more characteristic associated with the application and transmitting the mapping information to the hardened NoC.

In an aspect, the application traffic graph includes a plurality of nodes indicative of representations of traffic associated with the application, wherein the plurality of nodes interacts based on bandwidth requirements, latency requirements, protocol requirements and transactions retrieved.

In an aspect, the mapping information comprises transaction assignments of one or more traffic profiles to each NoC layer in the hardened NoC and route assignments for each NoC layer in the hardened NoC.

In an aspect, the hardened NoC further determines all allowed subsets of the plurality of application traffic profiles, and determine a NoC configuration that is configured to support the determined all allowed subsets. In another aspect, the NoC configuration is further includes one or more physical channels, one or more virtual channels, one or more NoC layers, Quality of Service (QoS) parameters for each of the one or more physical channels and the one or more virtual channels, and weights for each of the one or more physical channels and the one or more virtual channels.

In an aspect, the application traffic graph is received from a user. In another aspect, the application traffic graph is generated based on the traffic profile fed to the FPGA system. In yet another aspect, the application traffic graph is generated based on one or more meta-data associated with one or more packet received by the FPGA system.

In an aspect, the system is further configured to determine at least a part of application graph to be mapped with the hardened NoC and at least a part of application graph to be mapped with the soft logic.

In an aspect, the NoC includes a mechanism for being configured by software to modify one or more functions associated with the NoC. In another aspect, the one or more functions of the NoC are associated with any of combination quality of service (QoS), priority, virtual channel (VC) allocation, rate limits, buffer sizing, layer/physical channel assignment.

In an aspect, the NoC includes virtual channel (VC) and physical layers allocated based at least on quality of service (QoS), latency, bandwidth requirements, number of inputs/outputs (I/Os), memories, soft intellectual properties (IPs) that are connected to the NoC.

In an aspect, the NoC includes one or more bridges configured to support multiple protocols.

In an aspect, the NoC includes at least a programmable decoding element to determine any or combination of a route, a layer and destination information from one or more messages transported over the NoC.

An aspect of the present application relates to a non-transitory computer readable storage medium storing instructions for executing a process. The instructions include the steps of receiving an profile information associated with an application, retrieving at least a characteristic, selected from any or combination of a bandwidth requirement, latency requirement, protocol requirement and transactions, associated with the application from the profile information, generating at least one application traffic graph having mapping information based on the characteristic retrieved, and mapping the application traffic graph generated with into the FPGA using the hardened NoC.

The present application provides devices having a programmable fabric and a communication network integrated with the programmable fabric for high-speed data passing.

According to an example implementation, an FPGA incorporates one or more programmable NoCs or NoC components integrated within the FPGA fabric. In one example implementation, the NoC is used as system-level interconnect to connect computer and communication modules to one another and integrate large systems on the FPGA. The FPGA design flow is altered to target the NoC components either manually through designer intervention, or automatically. The computation and communication modules may be either constructed out of the FPGA's logic blocks block Random Access Memory (RAM) modules, multipliers, processor cores, input/output (I/O) controllers, I/O ports or any other computation or communication modules that can be found on FPGAs or heterogeneous devices based thereon.

The NoC or NoCs added to the FPGA involve routers and links, and optionally fabric ports. Routers refer to any circuitry that switches and optionally buffers data from one port to another. NoC routers may involve, but are not limited to, any of the following: crossbars, buffered crossbars, circuit-switched routers or packet-switched routers. Links are the connections between routers. In one example implementation NoC links are constructed out of the conventional FPGA interconnect which can involve different-length wire segments and multiplexers. In another example implementation, NoC links can involve dedicated metal wiring between two router ports. Both example implementations of the NoC links may include buffers or pipeline registers. The fabric port connects the NoC to the FPGA fabric and thus performs two key bridging functions. The first function of the fabric port is width adaptation between the computation or communication module and the NoC. In one example implementation, this is implemented as a multiplexer, a demultiplexer and a counter to perform time-domain multiplexing (TDM) and demultiplexing. The second function is clock-domain crossing; in one example implementation this is implemented as an asynchronous first-in first-out (FIFO) queue. Although the NoC targets digital electronic systems, all or parts of the presented NoC can be replaced using an optical network on chip. The NoC can also be implemented on a separate die in a 3D die stack.

Changes to the FPGA design flow to target NoCs may be divided into two categories; logical design and physical design. The logical design step concerns the functional design of the implemented system. In the logical design step all or part of the designed system is made latency-insensitive by adding wrappers to the modules. The logical design step also includes generating the required interfaces to connect modules to a NoC and programming the NoC for use. Programming the NoC includes, but is not limited to the following: configuring the routers, assigning priorities to data classes, assigning virtual channels to data classes and specifying the routes taken through the NoC. The physical design flow then implements the output of the logical design step on physical circuitry. It includes mapping computation and communication modules to NoC routers, and floor planning the mentioned modules onto the FPGA device. Together, these architecture and design flow changes due to the addition of NoCs to FPGAs will raise the level of abstraction of system-level communication, making design integration of large systems simpler and more automated and making system-level interconnect more efficient.

In an example implementation, a field-programmable gate array (FPGA) is an integrated circuit designed to be configured by a customer or a designer after manufacturing—hence "field-programmable". The FPGA configuration is generally specified using a hardware description language (HDL), similar to that used for an application-specific integrated circuit (ASIC). (Circuit diagrams were previously used to specify the configuration, as they were for ASICs, but this is increasingly rare.)

FPGAs contain an array of programmable logic blocks, and a hierarchy of reconfigurable interconnects that allow the blocks to be "wired together", like many logic gates that can be inter-wired in different configurations. Logic blocks can be configured to perform complex combinational functions, or logic gates such as AND, XOR, and so on. In most FPGAs, logic blocks also include memory elements, which may be simple flip-flops or more complete blocks of memory.

Figures 4A, 4B:
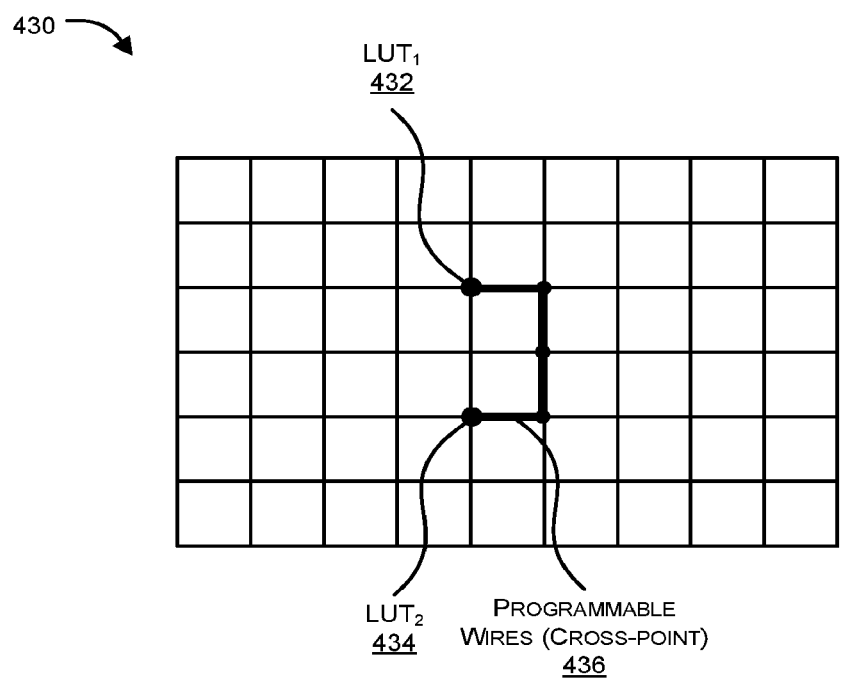
FIG. 4A illustrates a 1 Bit adder in FPGA.
FIG. 4B illustrates an FPGA comprising lookup tables (LUTs) and programmable wires.

FPGA includes a Lookup table (LUT) having bunch of inputs and bunch of outputs, wherein both inputs and outputs are programmable. Basically, one can configure input and output to achieve a specific/desired functioning. For example, if 1 Bit adder logic is to be implemented then there are four different logics i.e., (0, 0), (0, 1), (1, 0), (1, 1) and four different outputs. FIG. 4A 400 illustrates a 1 Bit adder in FPGA.

In an example implementation, the One-bit Full-Adder (FA) is used widely in systems with operations such as counter, addition, subtraction, multiplication and division etc. It is the basic core component of Arithmetic-Logic-Unit (ALU). Thus, the innovation and acceleration of FA means that the speed of the Central-Processor-Unit (CPU) and the speed of the whole system in general are accelerated. FA is a basic cell in the CPU and is so fundamental that changes to it are difficult to make. However, this cannot prevent researchers to try to increase the speed for FA.

In order to create one bit FA in the traditional methods, two's component gate must be used. This makes the circuit more complex, and when there is a subtraction of n bits, there should be an addition of n XOR gates. The FPGA device is becoming increasing popular, and the acceleration of the multiplexer and improvement in FPGA allow the configuration of the Look Up Table (LUT) in FPGA that functions as a memory or a logic functions. This especially allows the formation of many small LUT's inside a big LUT. New designs have the aim to increase the speed of FA based on LUT and Multiplexer.

Thus, FPGA works at the logic and tries to program the logic in the LUT by just exhaustively listing all the possible inputs and all the possible outputs. However, in a real system, there are many complex and many functionalities that need to be performed. Thus, multiple LUTs need to be internally connected to able to achieve multiple functions. However, to provide these connections in functionalities (programmable connections) there is a requirement of programmable set of wires.

For example, at FPGA there can be many LUTs (e.g., hundreds of millions) and can also involve plurality of wires, grids of wires and cross-points of wires that needs to be programmed and connected to work in sync with each other. Thus, there are needs for connecting multiple small logics together via, LUTs. Thus, the present invention provides a mechanism which enables to connect these FPGA's by way programming. FIG. 4B 430 illustrates an FPGA comprising lookup tables (LUTs) and programmable wires.

In an example implementation, as shown, $LUT_1$ 432 and $LUT_2$ 434 can be connected using programmable wires (cross-points) 436 to achieve connection to work in sync with each other.

Figure 4C:
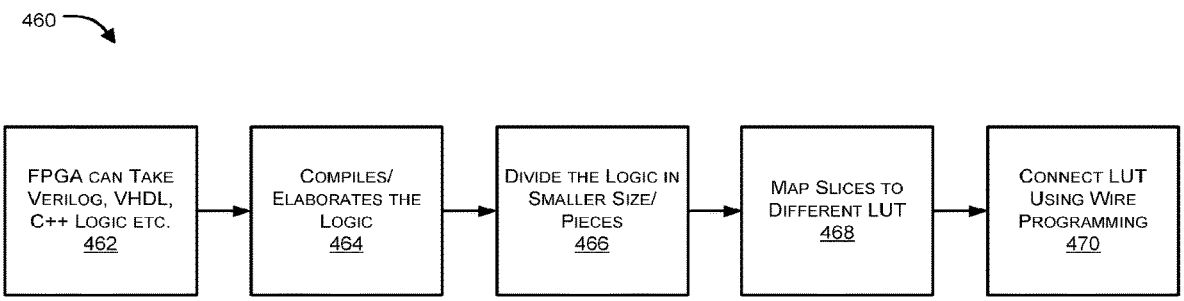
FIG. 4C illustrates a flow diagram for connecting LUTs using programmable wires as shown in FIG. 4B.

FIG. 4C 460 illustrates a flow diagram for connecting LUTs using programmable wires as shown in FIG. 4B. In order to connect plurality of LUTs using programmable wires, the present application at step 462, enables FPGA to receive Verilog, VHDL, C++ etc logics as inputs. At step 464, the FPGA compiles/elaborates the logic. At step 466, the FPGA divides the logic in smaller size/pieces. At step 468, the FPGA map slices to different LUTs. At step 470, the different LUTs are connected using wire programming.

However, while connecting the LUTs and programmable wires, there is a need to determine how many size/pieces of the logic are to be made, as well as how many connections are needed. If the size/pieces are too large then the LUT mapping may not be possible. One of the biggest obstacles is that LUTs may be upgraded/programmed with high frequencies. However, the wires are normally not upgraded/programmed with high frequencies.

Thus, the LUT and wires implement soft logic since it is programmable and are provided with less transparency and low frequency.

Example implementations described herein facilitate communication, which is required in FPGA, by packetizing the communication and can be transported over a hardened network voucher that is present in FPGA along with the soft logic. The example implementations facilitate the achievement of hardened logic (non-re-programmable) based on the soft logic. Such implementations can achieve a benefit that it has much high frequency which is achieved by low latency and higher bandwidth for the same number of wires.

FPGAs are embedded/incorporated with NoCs wherein the NoCs give an ability to transfer packets from one point to other point.

Also, once the Hardened NoC is built over the FPGA there is a need for mapping the traffic incoming and outgoing to a particular layer or merchant channel of within layer routing their needs a flexibility to choose route for the traffic (since there are multiple routes present). The flow can have different requirements in terms of bandwidth or burstiness etc. Hardened NoC can have layer flexibility, VC flexibility, and route flexibility. Application Mapping indicates how these layers, VCs and routes used for a particular application efficiently and meeting all the requirements and constraints of the system.

Figure 5:
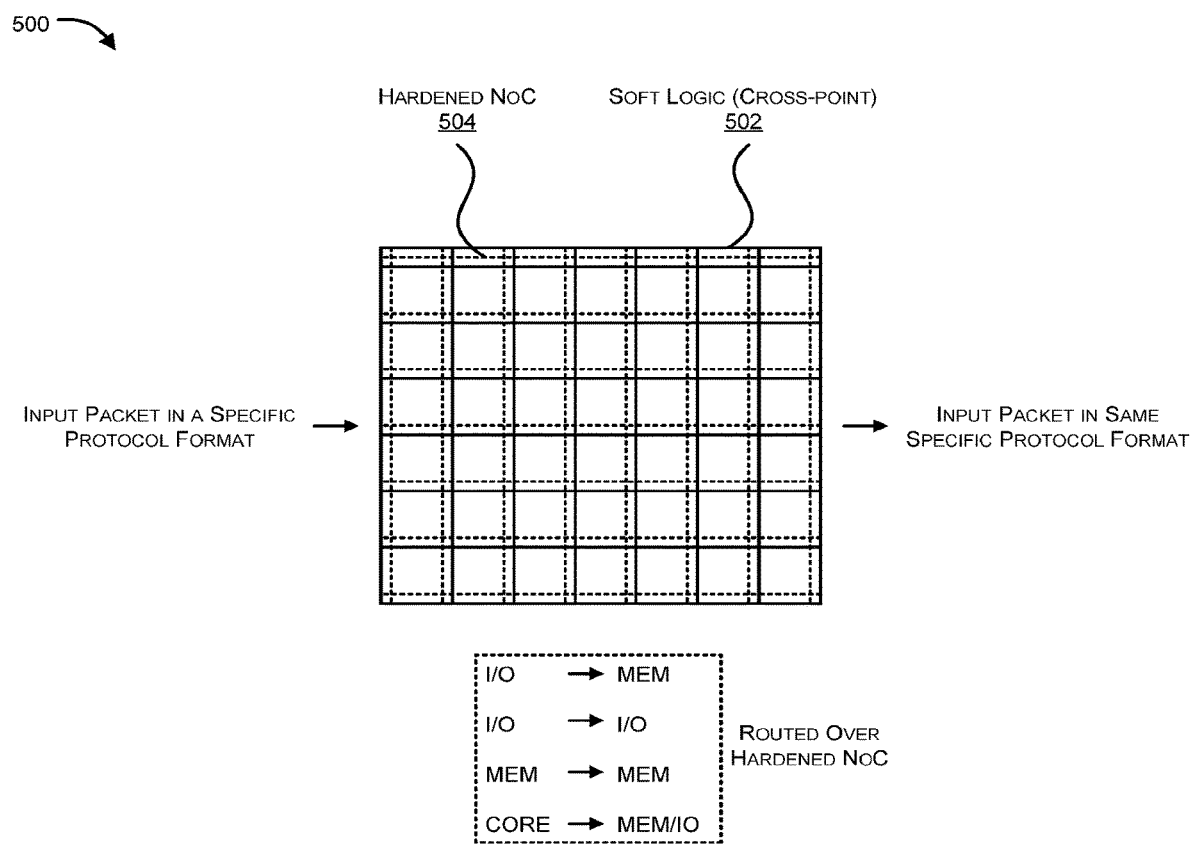
FIG. 5 illustrates a Field-Programmable Gate-Array (FPGA) system having soft logic and hardened logic.

Referring now to FIG. 5 a Field-Programmable Gate-Array (FPGA) 500 system having soft logic and hardened logic is illustrated. As shown, a soft logic can be implemented using programmable wires (cross-point) 502 and a hardened logic can be implemented using hardened NoC 504. The input packet entering in a FPGA 500 recited as "input packet in a specific protocol format" can be routed either through the programmable wires (cross-point) 502 or through the hardened NoC 504 to generate an output in the form of packet recited as "input packet in same specific protocol format".

In an example implementation, the inputs can be received by from Ethernet interface, Peripheral Component Interconnect (PCI) interface, Serializer/Deserializer (SerDes) interface, and the like.

In an example implementation, the input received can be in a particular specific protocol format having source and destination information which can directly routed to the destination without any alteration in the particular specific protocol format using a hardened network topology of the NoC. In another example implementation, the input received can be a particular specific protocol format having source but no destination information, cannot be directly routed to the destination but through using soft logic (cross-connection) and needs to be analyzed and then without any alteration in the particular specific protocol format routed to its destination.

In an example implementation, the packets coming in FPGA and going out are in the form of messages so they are suitable candidate over the hard NoC. The packets inside FPGA core assessing the memory can also be routed over the NoC.

In an example implementation, the present application allows the system to decide which packets are to be sent to NoC and which needs to be routed through FPGA. The packets which are in the form of messages and which has fixed source destination or rout to be followed can be routed through the NoC. More specifically, the messages which have specific details and destination are far away from each other passes through the NoC.

In an example implementation, in NoC there are bridges along with other sub-components. The bridges are used for receiving packets and convert the packet into NoC protocol format. Those bridges also have some cost for example in terms of area.

In an example implementation, a cost of a NoC is compared with the cost of a soft logic and if it is much greater than that of soft logic the NoC are not much beneficial.

In an example implementation, bridges in the NoC are provided to support certain protocols. The bridges included in the NoC can have 4 exemplary design choices. First exemplary design choice is a superset bridge that can support all the protocols however such bridge is excessively large and not cost effective. Second exemplary design choice is a bridge which can be built based on the requirements/compatibility. The soft logic in this type is aware about the placement of the bridges to satisfy the requirements of sufficiency of the bridges for communications. Third exemplary design choice is to not harden at all but to have bridges that includes only soft logic. However, even if NoC is operating at higher frequency, the bridges may run at lower frequency. Fourth exemplary design choice for bridges is to divide bridges in protocol part and packet switching part so packet switching can be hardened and protocol part can be soft switching which may not give you ideal design but can provide a descent achievable performance.

In an example implementation, the topology for NoC depends on plurality of factors. Few of the exemplary factors can include but are not limited to types of applications that are being performed using the FPGA. For example, applications functionality can be examined to decide topology based on data/traffic flow for applications, message sizes, functions of the applications, distance of the applications etc.

Figure 6:
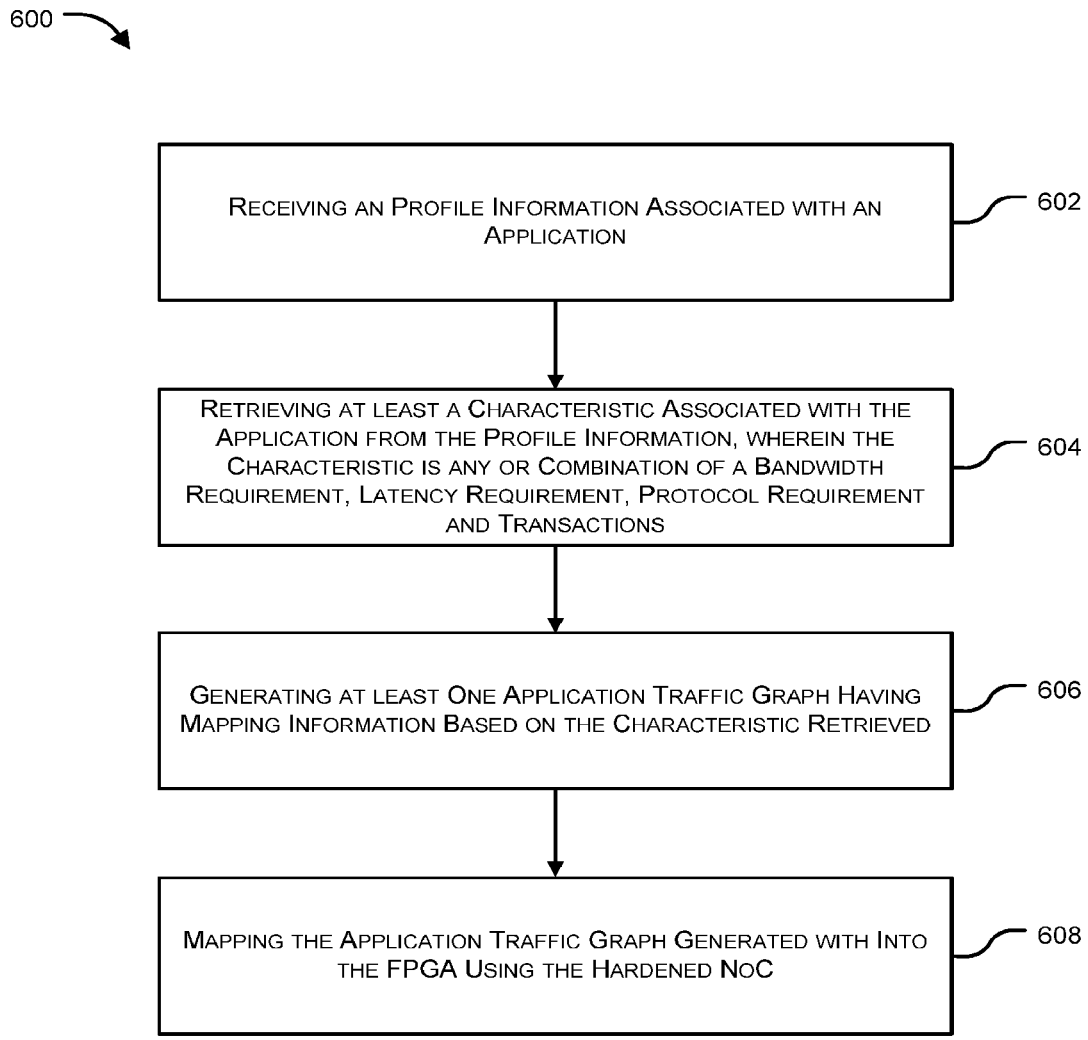
FIG. 6 illustrates exemplary flow diagram for the Field-Programmable Gate-Array (FPGA) system.

FIG. 6 600 illustrates an example flow diagram for the Field-Programmable Gate-Array (FPGA) system. The method at step 602 receives profile information associated with an application by a Network-on-Chip (NoC), at step 604 retrieves at least a characteristic, selected from any one or any combination of a bandwidth requirement, latency requirement, protocol requirement and transactions, associated with the application from the profile information, at step 606 generates at least one application traffic graph having mapping information based on the characteristic retrieved, and at step 608 maps the application traffic graph generated with into the FPGA using the hardened NoC.

In an aspect, while the hardened NoC is deployed in the FPGA, reconfiguring the hardened NoC in accordance with the application traffic graph. In another aspect, reconfiguring the hardened NoC comprises receiving mapping information for one or more characteristic associated with the application and transmitting the mapping information to the hardened NoC.

In an aspect, the application traffic graph includes a plurality of nodes indicative of representations of traffic associated with the application, wherein the plurality of nodes interacts based on bandwidth requirements, latency requirements, protocol requirements and transactions retrieved.

In an aspect, the mapping information comprises transaction assignments of one or more traffic profiles to each NoC layer in the hardened NoC and route assignments for each NoC layer in the hardened NoC.

In an aspect, the hardened NoC further determines all allowed subsets of the plurality of application traffic profiles, and determine a NoC configuration that is configured to support the determined all allowed subsets. In another aspect, the NoC configuration is further includes one or more physical channels, one or more virtual channels, one or more NoC layers, Quality of Service (QoS) parameters for each of the one or more physical channels and the one or more virtual channels, and weights for each of the one or more physical channels and the one or more virtual channels.

In an aspect, the application traffic graph is received from a user. In another aspect, the application traffic graph is generated based on the traffic profile fed to the FPGA system. In yet another aspect, the application traffic graph is generated based on one or more meta-data associated with one or more packet received by the FPGA system.

In an aspect, the method can further determine at least a part of application graph to be mapped with the hardened NoC and at least a part of application graph to be mapped with the soft logic.

In an aspect, the NoC includes a mechanism for being configured by software to modify one or more functions associated with the NoC. In another aspect, the one or more functions of the NoC are associated with any of combination quality of service (QoS), priority, virtual channel (VC) allocation, rate limits, buffer sizing, layer/physical channel assignment.

In an aspect, the NoC includes virtual channel (VC) and physical layers allocated based at least on quality of service (QoS), latency, bandwidth requirements, number of inputs/outputs (I/Os), memories, soft intellectual properties (IPs) that are connected to the NoC.

In an aspect, the NoC includes one or more bridges configured to support multiple protocols.

In an aspect, the NoC includes at least a programmable decoding element to determine any or combination of a route, a layer and destination information from one or more messages transported over the NoC.

Figure 7:
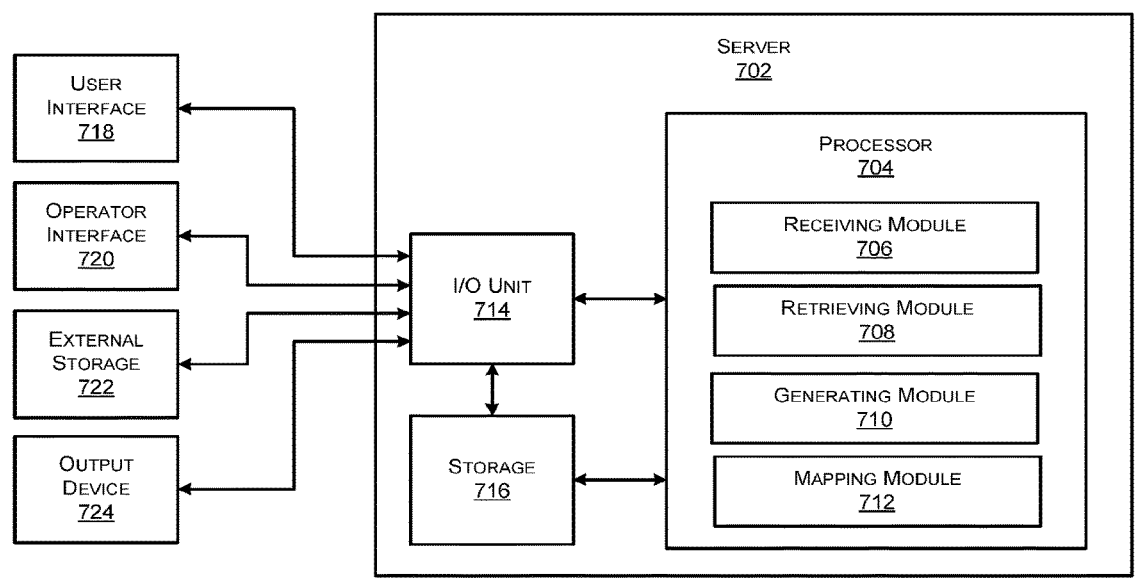
FIG. 7 illustrates an example computer system on which example implementations may be implemented.

FIG. 7 illustrates an example computer system on which example implementations may be implemented. This example system is merely illustrative, and other modules or functional partitioning may therefore be substituted as would be understood by those skilled in the art. Further, this system may be modified by adding, deleting, or modifying modules and operations without departing from the scope of the inventive concept.

In an aspect, computer system 700 includes a server 702 that may involve an I/O unit 714, storage 716, and a processor 704 operable to execute one or more units as known to one skilled in the art. The term "computer-readable medium" as used herein refers to any medium that participates in providing instructions to processor 704 for execution, which may come in the form of computer-readable storage mediums, such as, but not limited to optical disks, magnetic disks, read-only memories, random access memories, solid state devices and drives, or any other types of tangible media suitable for storing electronic information, or computer-readable signal mediums, which can include transitory media such as carrier waves. The I/O unit processes input from user interfaces 718 and operator interfaces 720 which may utilize input devices such as a keyboard, mouse, touch device, or verbal command.

The server 702 may also be connected to an external storage 722, which can contain removable storage such as a portable hard drive, optical media (CD or DVD), disk media or any other medium from which a computer can read executable code. The server may also be connected an output device 724, such as a display to output data and other information to a user, as well as request additional information from a user. The connections from the server 702 to the user interface 718, the operator interface 720, the external storage 722, and the output device 724 may via wireless protocols, such as the 802.11 standards, Bluetooth® or cellular protocols, or via physical transmission media, such as cables or fiber optics. The output device 724 may therefore further act as an input device for interacting with a user.

The processor 704 may execute one or more modules including includes a receiving module 706 receive an profile information associated with an application, a retrieving module 708 to retrieve at least a characteristic, selected form any of combination of any or combination of a bandwidth requirement, latency requirement, protocol requirement and transactions, associated with the application from the profile information, a generating module 710 to generate at least one application traffic graph having mapping information based on the characteristic retrieved, and a mapping module 712 to map the application traffic graph generated with into the FPGA using the hardened NoC.

In an aspect, while the hardened NoC is deployed in the FPGA, reconfiguring the hardened NoC in accordance with the application traffic graph. In another aspect, reconfiguring the hardened NoC comprises receiving mapping information for one or more characteristic associated with the application and transmitting the mapping information to the hardened NoC.

In an aspect, the application traffic graph includes a plurality of nodes indicative of representations of traffic associated with the application, wherein the plurality of nodes interacts based on bandwidth requirements, latency requirements, protocol requirements and transactions retrieved.

In an aspect, the mapping information comprises transaction assignments of one or more traffic profiles to each NoC layer in the hardened NoC and route assignments for each NoC layer in the hardened NoC.

In an aspect, the hardened NoC further determines all allowed subsets of the plurality of application traffic profiles, and determine a NoC configuration that is configured to support the determined all allowed subsets. In another aspect, the NoC configuration is further includes one or more physical channels, one or more virtual channels, one or more NoC layers, Quality of Service (QoS) parameters for each of the one or more physical channels and the one or more virtual channels, and weights for each of the one or more physical channels and the one or more virtual channels.

In an aspect, the application traffic graph is received from a user. In another aspect, the application traffic graph is generated based on the traffic profile fed to the FPGA system. In yet another aspect, the application traffic graph is generated based on one or more meta-data associated with one or more packet received by the FPGA system.

In an aspect, the system is further configured to determine at least a part of application graph to be mapped with the hardened NoC and at least a part of application graph to be mapped with the soft logic.

In an aspect, the NoC includes a mechanism for being configured by software to modify one or more functions associated with the NoC. In another aspect, the one or more functions of the NoC are associated with any of combination quality of service (QoS), priority, virtual channel (VC) allocation, rate limits, buffer sizing, layer/physical channel assignment.

In an aspect, the NoC includes virtual channel (VC) and physical layers allocated based at least on quality of service (QoS), latency, bandwidth requirements, number of inputs/outputs (I/Os), memories, soft intellectual properties (IPs) that are connected to the NoC.

In an aspect, the NoC includes one or more bridges configured to support multiple protocols.

In an aspect, the NoC includes at least a programmable decoding element to determine any or combination of a route, a layer and destination information from one or more messages transported over the NoC.

It may be appreciated that, the nodes of the application graph are floating since the positions of the nodes are not specified in FPGA all the time. For examples, cores are not frozen.

It may also be appreciated that, there is also a requirement of application load balancing in automated manner. Thus, the present application enables to decide mapping, however once mapping is decided, it is required to program those mapping in the IOs of the FPGA. Therefore there is requirement of hardware built in FPGA which is programmable so that the mapping can be performed when FPGA is deployed.

Unless specifically stated otherwise, as apparent from the discussion, it is appreciated that throughout the description, discussions utilizing terms such as "processing," "computing," "calculating," "determining," "displaying," or the like, can include the actions and processes of a computer system or other information processing device that manipulates and transforms data represented as physical (electronic) quantities within the computer system's registers and memories into other data similarly represented as physical quantities within the computer system's memories or registers or other information storage, transmission or display devices.

Example implementations may also relate to an apparatus for performing the operations herein. This apparatus may be specially constructed for the required purposes, or it may include one or more general-purpose computers selectively activated or reconfigured by one or more computer programs. Such computer programs may be stored in a computer readable medium, such as a computer-readable storage medium or a computer-readable signal medium. A computer-readable storage medium may involve tangible mediums such as, but not limited to optical disks, magnetic disks, read-only memories, random access memories, solid state devices and drives, or any other types of tangible or non-transitory media suitable for storing electronic information. A computer readable signal medium may include mediums such as carrier waves. The algorithms and displays presented herein are not inherently related to any particular computer or other apparatus. Computer programs can involve pure software implementations that involve instructions that perform the operations of the desired implementation.

Various general-purpose systems may be used with programs and modules in accordance with the examples herein, or it may prove convenient to construct a more specialized apparatus to perform desired method steps. In addition, the example implementations are not described with reference to any particular programming language. It will be appreciated that a variety of programming languages may be used to implement the teachings of the example implementations as described herein. The instructions of the programming language(s) may be executed by one or more processing devices, e.g., central processing units (CPUs), processors, or controllers.

As is known in the art, the operations described above can be performed by hardware, software, or some combination of software and hardware. Various aspects of the example implementations may be implemented using circuits and logic devices (hardware), while other aspects may be implemented using instructions stored on a machine-readable medium (software), which if executed by a processor, would cause the processor to perform a method to carry out implementations of the present application. Further, some example implementations of the present application may be performed solely in hardware, whereas other example implementations may be performed solely in software. Moreover, the various functions described can be performed in a single unit, or can be spread across a number of components in any number of ways. When performed by software, the methods may be executed by a processor, such as a general purpose computer, based on instructions stored on a computer-readable medium. If desired, the instructions can be stored on the medium in a compressed and/or encrypted format.

Moreover, other implementations of the present application will be apparent to those skilled in the art from consideration of the specification and practice of the example implementations disclosed herein. Various aspects and/or components of the described example implementations may be used singly or in any combination. It is intended that the specification and examples be considered as examples, with a true scope and spirit of the application being indicated by the following claims.

What is claimed is:

1. A system, comprising:
   programmable logic circuitry; and
   a Network-on-Chip (NoC) having a hardened network topology, wherein the NoC is configured to be configured to share data between endpoints of a plurality of endpoints in the programmable logic circuitry, wherein the NoC is configured to be programmed based on a traffic specification comprising a quality of service (QOS) and a bandwidth requirement of at least a portion of the NoC, wherein the NoC is configured to be reconfigured to modify one or more functions associated with the NoC, wherein the one or more modified functions are associated with priorities of classes of data, wherein the NoC is configured to be reconfigured based on mapping information, wherein the mapping information comprises one or more routing assignments for two or more NoC layers, wherein the one or more routing assignments modify a flow of data through the two or more NoC layers, and wherein the NoC comprises:
   a plurality of routers, wherein respective routers of the plurality of routers comprise router circuitry to switch data from a first port of that router to a second port of that router;
   a plurality of links, wherein respective links of the plurality of links comprise dedicated metal wiring between a first router and a second router of the plurality of routers; and
   a plurality of fabric ports, wherein respective fabric ports of the plurality of fabric ports connect the NoC to an endpoint in the programmable logic circuitry.

2. The system of claim 1, wherein the one or more functions are associated with the NoC, wherein the one or more functions are associated with rate limits, buffer sizing, layer or physical channel assignment, or any combination thereof.

3. The system of claim 1, wherein the NoC is configured to be reconfigured, while programmed according to the traffic specification, by transmitting, to the NoC, mapping information for one or more characteristics associated with an additional traffic specification.

4. The system of claim 3, wherein the additional traffic specification comprises a plurality of representations of traffic on the NoC, wherein respective representations of the plurality of representations correspond to respective endpoints of the plurality of endpoints, and wherein the endpoints of the plurality of endpoints interact with one another based on bandwidth requirements and latency requirements.

5. The system of claim 1, wherein the NoC is configured to be configured to implement:
   one or more physical channels;
   one or more virtual channels; or
   a combination thereof.

6. The system of claim 5, wherein the one or more NoC layers are connected to a respective endpoint of the plurality of endpoints.

7. The system of claim 6, wherein the respective endpoint is communicatively coupled to the one or more NoC layers via the plurality of routers.

8. The system of claim 7, wherein a respective NoC layer of the one or more NoC layers comprises a single router of the plurality of routers.

9. The system of claim 1, wherein reconfiguring the NoC based on the mapping information comprises hardened circuitry of the NoC implementing the modifying of the one or more functions.

10. A programmable logic device system, comprising:
    programmable logic circuitry; and
    a System-on-Chip (SoC) comprising a Network-on-Chip (NoC) having a hardened network topology, wherein the NoC is configured to be configured to share data between endpoints of a plurality of endpoints in the programmable logic circuitry, wherein the NoC is configured to be programmed based on a traffic specification comprising a quality of service (QoS) and a bandwidth requirement of at least a portion of the NoC, wherein the NoC is configured to be reconfigured in accordance with one or more additional traffic specifications, wherein the NoC is configured to be reconfigured to modify one or more functions associated with the NoC, wherein the NoC is configured to be reconfigured by transmitting, to the NoC, mapping information for one or more characteristics associated with the traffic specification, wherein the mapping information comprises one or more routing assignments for two or more NoC layers, and wherein the one or more routing assignments modify a flow of data through the two or more NoC layers, wherein the one or more modified functions are associated with priorities of classes of data, and wherein the NoC comprises:
- a plurality of routers, wherein respective routers of the plurality of routers comprise router circuitry to switch data from a first port of the router to a second port of the router;
- a plurality of links, wherein respective links of the plurality of links comprise dedicated paths between a first router and a second router of the plurality of routers; and
- a plurality of fabric ports, wherein respective fabric ports of the plurality of fabric ports connect the NoC to an endpoint in the programmable logic circuitry.

11. The programmable logic device system of claim 10, wherein the one or more functions are associated with virtual channel (VC) allocation, rate limits, buffer sizing, layer or physical channel assignment, or any combination thereof.

12. The programmable logic device system of claim 10, wherein the programmable logic circuitry comprises one or more lookup tables (LUTs).

13. The programmable logic device system of claim 10, wherein the traffic specification comprises a plurality of representations of traffic on the NoC, wherein respective representations of the plurality of representations correspond to respective endpoints of the plurality of endpoints, and wherein the endpoints of the plurality of endpoints interact based on respective bandwidth requirements and respective latency requirements.

14. The programmable logic device system of claim 10, wherein reconfiguring the NoC comprises receiving the mapping information for one or more characteristics associated with an application and transmitting the mapping information to the NoC.

15. The programmable logic device system of claim 10, wherein the flow of data through the two or more NoC layers is through a cross-point.

16. The programmable logic device system of claim 15, wherein the cross-point comprises a vertical channel between a first point in a first layer and a second point in a second layer.

17. A non-transitory computer-readable medium comprising instructions that, when executed by one or more processors, cause the one or more processors to:
- generate one or more traffic specifications having mapping information based on bandwidth requirements, latency requirements, or both;
- cause a Network-on-Chip (NoC) to be implemented on an electronic device in accordance with the one or more traffic specifications, wherein, when implemented on the electronic device, the NoC is configured to share data between endpoints of a plurality of endpoints in programmable logic circuitry of the electronic device; and
- cause, based on mapping information comprising one or more routing assignments of two or more NoC layers, the NoC to be reconfigured in accordance with one or more additional traffic specifications, wherein the NoC is configured to be reconfigured to modify one or more functions associated with the NoC, wherein the one or more modified functions are associated with priorities of classes of data, wherein the one or more routing assignments modify a flow of data through the two or more NoC layers to implement the one or more functions, wherein reconfiguring the NoC based on the mapping information comprises hardened circuitry of the NoC implementing the modifying of the one or more functions, and wherein the NoC comprises:
  - a plurality of routers, wherein respective routers of the plurality of routers comprise router circuitry to switch data from a first port of that router to a second port of that router;
  - a plurality of hardened links, wherein respective links of the plurality of hardened links comprises dedicated metal wiring paths between a first router and a second router of the plurality of routers; and
  - a plurality of fabric ports, wherein respective fabric ports of the plurality of fabric ports connect the NoC to an endpoint in the programmable logic circuitry.

18. The non-transitory computer-readable medium of claim 17, wherein the router circuitry is hardened.

19. The non-transitory computer-readable medium of claim 17, wherein the one or more additional traffic specifications comprise second bandwidth requirements and second latency requirements.

20. The non-transitory computer-readable medium of claim 17, wherein the one or more traffic specifications comprises a plurality of representations of traffic on the NoC, wherein respective representations of the plurality of representations correspond to respective endpoints of the plurality of endpoints, wherein the plurality of endpoints interact based on the bandwidth requirements, latency requirements, or both.

* * * * *